US006819605B2

(12) United States Patent
Kato

(10) Patent No.: US 6,819,605 B2
(45) Date of Patent: Nov. 16, 2004

(54) SEMICONDUCTOR MEMORY DEVICE AND REDUNDANCY JUDGING METHOD

(75) Inventor: Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 234 days.

(21) Appl. No.: 10/265,254

(22) Filed: Oct. 7, 2002

(65) Prior Publication Data

US 2003/0095449 A1 May 22, 2003

(30) Foreign Application Priority Data

Nov. 16, 2001 (JP) ........................................ 2001-351549
Aug. 19, 2002 (JP) ........................................ 2002-237848

(51) Int. Cl.$^7$ ................................................ G11C 7/00
(52) U.S. Cl. ................................ 365/200; 365/189.07
(58) Field of Search ............................ 365/200, 189.07

(56) References Cited

U.S. PATENT DOCUMENTS 6,188,620 B1 * 2/2001 Shibuya ...................... 365/200
6,269,034 B1 * 7/2001 Shibuya ...................... 365/200
6,272,056 B1 * 8/2001 Ooishi ......................... 365/200

FOREIGN PATENT DOCUMENTS

| JP | 3-252998 | 11/1991 |
|---|---|---|
| JP | 5-144286 | 6/1993 |
| JP | 5-307898 | 11/1993 |
| JP | 6-124599 | 5/1994 |
| JP | 11-066880 | 3/1999 |
| JP | 11-224499 | 8/1999 |

* cited by examiner

Primary Examiner—Son Mai
(74) Attorney, Agent, or Firm—Arent Fox, PLLC

(57) ABSTRACT

There is provided a semiconductor memory device and a redundancy judging method which can reduce current consumption when a static-type redundancy judging operation is performed. In case absence of substitute to auxiliary memory cells is set, a non-redundancy setting signal Jdg is set in high logic level and the comparing unit 3 is inactivated and has an operation thereof stopped. Logic fixing unit 5 is connected to respective comparison results E0–$n$. The logic fixing unit 5 is activated in response to the non-redundancy setting signal Jdg of high logic level and fixes the respective comparison results E0–$n$ to a predetermined logic level. The predetermined logic level is a value which indicates the discordance of the comparison results E0–$n$ and hence, logic composing unit 7 judges that address information and redundancy address information discord with each other. Since the comparison operation is stopped at the comparing unit 3 which constitute an initial stage of the redundancy judging operation for every redundancy judging unit 1 so that the operations of the comparing unit 3 and the logic composing unit 7 are stopped whereby undesired current consumption can be reduced.

27 Claims, 12 Drawing Sheets

FIRST PRINCIPLE WITH RESPECT TO REDUNDANCY JUDGMENT OF THE PRESENT INVENTION

FIRST PRINCIPLE WITH RESPECT TO REDUNDANCY JUDGMENT OF THE PRESENT INVENTION

FIG. 2 SECOND PRINCIPLE WITH RESPECT TO REDUNDANCY JUDGMENT OF THE PRESENT INVENTION

FIG. 3 SPECIFIC EXAMPLE OF COMPARING SECTION WHICH PERFORMS ACCORDANCE COMPARING WITH RESPECT TO ADDRESS INFORMATION

SPECIFIC EXAMPLE OF LOGIC COMPOSING SECTION

FIG. 5 REDUNDANCY JUDGING CIRCUIT OF FIRST EMBODIMENT

FIG. 6  SPECIFIC EXAMPLE OF REDUNDANCY JUDGING CIRCUIT OF FIRST EMBODIMENT

FIG. 7 REDUNDANCY JUDGING CIRCUIT OF SECOND EMBODIMENT

FIG. 8 SPECIFIC EXAMPLE OF REDUNDANCY JUDGING CIRCUIT OF SECOND EMBODIMENT

CIRCUIT DIAGRAM OF FIRST PRIOR ART

CIRCUIT DIAGRAM OF SECOND PRIOR ART

FIG. 11  PRIOR ART  SCHEMATIC VIEW SHOWING REDUNDANCY OF WORD LINES

DISTRIBUTION DIAGRAM SHOWING DATA HOLDING TIME CHARACTERISTICS OF MEMORY CELLS

SEMICONDUCTOR MEMORY DEVICE AND REDUNDANCY JUDGING METHOD

BACKGROUND OF THE INVENTION

1. Field of the Invention

The present invention relates to the reduction of current consumption in redundancy judging unit of a semiconductor memory device, and more particularly to the reduction of current consumption when a static-type redundancy judging unit is used.

2. Description of the Related Art

Conventionally, with respect to a semiconductor memory device, the demand for finer circuit design and large capacity have been accelerated. However, the occurrence probability of defects on layout derived from particles or the like has been increased along with the finer circuit design, while the occurrence probability of defects has been also increased derived from the increase of die size along with the increase of capacity whereby, as a whole, there has been observed a tendency that the number of defects in memory cells has been increasing. Accordingly, there has been observed a tendency that the number of defective memory cells to be relieved is increasing due to the failure of characteristics derived from defects. Along with the increase of the number of defective memory cells, the number of redundancy judging circuits for replacing the defective memory cells with auxiliary memory cells is increased whereby the current consumption caused by the redundancy judging operation has been increasing. Since the judging operation is performed each time an access operation to the memory cells is performed, the reduction of current consumption caused by the redundancy judging operation has been demanded.

Further, in the technical field of portable equipment which has been sharply developed recently, along with the increase of functions incorporated into the portable equipment, a semiconductor memory device having a large capacity has been demanded and hence, a dynamic random access memory (hereinafter referred to as "DRAM") has been adopted in view of the high integration density of a memory cell structure. The DRAM which is mounted in the portable equipment has been subjected to the refreshing operation such as the self-refreshing operation or the like even in the non-access period during standby time. Here, with respect to the current consumption at the time of refreshing operation, except for the selection of memory cell and the operation of a memory cell core section such as the amplification of cell data, the judging operation performed by the redundancy judging circuit occupies a large portion of the operation of peripheral circuits. Accordingly, with respect to the portable equipment such as a portable telephone or a digital camera which is held in the standby state for a long period, to enhance the continuous service time characteristics at the time of driving a battery, it is dispensable to reduce the current consumption at the standby state. Accordingly, the reduction of the current consumption of the redundancy judging operation at the time of refreshing operation in the semiconductor memory device such as DRAM or the like is extremely important.

To cope with the demand for the reduction of current consumption of the above-mentioned redundancy judging operation, in the first prior art shown in FIG. 9 corresponding to Japanese Laid-open Patent Publication No. 5-252998, a power-on signal PON is set in low level when the power is turned on. When a fuse 603 is cut, an output of a latch circuit 604 is set in high level, p-channel transistors 608, 609 and 610 are turned on so that the redundancy judging function realized by a redundancy address judging circuit 300 becomes effective. When the fuse 603 is not cut, the output of the latch circuit 604 is set in low level and the three p-channel transistors 608, 609 and 610 are turned off so that the redundancy address judging circuit 300 becomes inoperative. When there exists no defective memory cell or an auxiliary memory cell is not used, the current consumption is reduced by stopping the operation of the redundancy address judging circuit 300.

Further, as the second prior art, comparing/selecting unit disclosed in Japanese Laid-open Patent Publication No. 3-307898 is shown in FIG. 10. Storing of defective cell addresses to fuse elements F110 to Fn20 of a comparing/selection circuit 100 is performed by cutting the fuse elements which correspond to a bit "1" among bits A1 to An or complements thereof A1b to Anb of corresponding input address codes. At a point of time that an input address code which coincides with the address of the defective cell is supplied to a comparing/selecting circuit 100, the bit "1" is received by a gate electrode and the fuse elements which are connected to transistors Q110 to Qn20 to be turned on are all cut so that a driving voltage from a driving pulse supply circuit 120 holds the value as it is at an output node N100. When the input address code does not coincide with the address of the defective cell, since there exists at least one transistor which is connected to the fuse element which is not cut and receives the bit "1" at the gate electrode, the potential of the output node N100 is lowered to a ground potential. The supply of the driving voltage to the output node N100 is performed through the fuse element F100 and the transistor Q100 of a driving pulse supply circuit 120. However, with respect to the surplus comparing/selecting circuit 100, the fuse element F100 is cut so as to stop the generation of an electric current which flows into the output node N100 whereby the consumption of power can be saved.

Further, in the portable equipment, it is necessary to reduce the current consumption during standby time as much as possible. Accordingly, with respect to a DRAM served for operation, there have been proposed several methods for reducing the current consumption generated by the refreshing operation which is a major factor causing current consumption during standby time as much as possible. Relieving of defective memory cells using a so-called refreshing redundancy is one of such measures.

In FIG. 11 and FIG. 12, a concept of refreshing redundancy is shown. In FIG. 11, a memory cell core section 1000 of a semiconductor memory device is shown schematically. The memory cell core section 1000 is constituted of a memory cell array section 1100 and an auxiliary memory cell array section 1200. In the memory cell array section 1100, memory cells (MC0 to MC2 and the like) are properly arranged at intersections of word lines WL0 to WLn and bit lines BL0 to BLn. In the auxiliary memory cell array section 1200, redundancy memory cells (SMC0 and the like) are properly arranged at intersections of redundancy word lines SWL0 to SWLm and redundancy bit lines SBL0 to SBLn.

Further, FIG. 12 schematically shows the characteristic distribution of memory cells using a data holding time tREF of the memory cells (MC0 to MC2 and the like) as a parameter. Using a data holding time t1 (tREF=t1) as a lower limit value of data holding characteristics, the memory cells (MC0 and the like) which have the data holding time tREF longer than the lower limit value constitute normal memory cells. The memory cells (MC2 and the like) having characteristics in which the data holding time tREF is below the lower limit value t1 and reaches a lowermost limit value t0

(lower limit value in a usual DRAM) constitute memory cells having defective tREF characteristics. The memory cells (MC1 and the like) whose data holding time tREF is equal to or below the lowermost limit value t0 include, as shown in FIG. 11, the memory cells which are not accessible due to a layout defect such as the disconnection of the word line WL1 and these memory cells constitute access disabled memory cells (MC1 and the like).

In the memory cells, since a charge stored in a memory cell capacitor is lowered below the reference voltage in the data holding time tREF and the data is dissipated, it is necessary to set a period of refreshing within the data holding time tREF. Accordingly, the memory cells (MC1, MC2 and the like) whose data holding characteristics are equal to or below the lower limit value t0 of the data holding time tREF are treated as defective cells. Recently, DRAMs have been used in the portable equipments and the demand for the reduction of current consumption during standby time has been sharply increasing. In view of such circumstances, because of the necessity to reduce the current consumption at the time of performing the refreshing operation which constitutes a major factor in the current consumption during standby time, the longer refreshing period has been requested compared to conventional art, and hence, a strict specification is set such that the lower limit value of the data holding time tREF is set to a lower limit value t1 compared to a lowermost limit value t0 for usual DRAM use.

Accordingly, the memory cells (MC2 and the like) which have been judged as normal cells in the usual DRAM use are judged as defective cells thus leading to the reduction of the yield rate. The refreshing redundancy is a method which has been provided for preventing this reduction of the yield rate. The usual relieving of defects of memory cells using the auxiliary memory cells, aims at relieving access disabled cells (MC1 and the like), wherein the word line WL1 is can be changed to the redundant word line SWL0 shown in FIG. 11. The refreshing redundancy also aims at, in addition to the above, changing cells having defective data holding characteristics (MC2 and the like) to redundant cells. On the memory cell array section 1100, the memory cells (MC2 and the like) are distributed at arbitrary positions and respective word lines WL2, WLk, WLn can be changed to the redundant word lines SWL1, SW2, SWLm. The refreshing redundancy contributes to the enhancement of the yield rate of DRAMs whose refreshing period is long and the current consumption during standby time is reduced.

In adopting the refreshing redundancy, in addition to the auxiliary memory cells for relieving the access disabled cells (MC1 and the like), the cells having defective data holding characteristics (MC2 and the like) which are widely distributed within the memory cell array section 1100 are also relieved and hence, a larger number of redundancy judging circuits are necessary than usual DRAMs. The reduction of the current consumption of the redundancy judging circuits has been requested also from this aspect.

In the prior art, by performing the redundancy judging operation by the redundancy judging circuits only when the auxiliary memory cells are used so as to reduce the current consumption in the redundancy judging circuits when the relieving by the auxiliary memory cells is not performed. However, this prior art has a drawback that the current consumption reduction effect is insufficient. Particularly, when the DRAM is used in the application such as the portable equipment in which it is necessary to reduce the standby current to an extreme, it is necessary to drastically reduce the current consumption by the redundancy judging circuits at the time of refreshing operation. However, the prior art is insufficient to cope with such a situation and there arises several problems. To be more specific, following problems exist.

In Japanese Laid-open Patent Publication No. 3-252998, by preventing the fuse 603 from being cut when the defective memory cell is not present and the auxiliary memory cell is not used, it is possible to reduce the current consumption by stopping the operation of the redundancy address judging circuit 300. However, the fuse 603 merely indicates the judgment whether the semiconductor memory device uses the auxiliary memory cells or not so that when the auxiliary memory cell is used, the fuse 603 is cut and the redundancy address judging circuit 300 is operated. Accordingly, when the auxiliary memory cells are present in a plural number and any one of them is used, all redundancy address judging circuits 300 are operated so that the redundancy address judging circuit 300 which is unused and is not necessary to operate is also operated. Accordingly, there arises a problem that the current is wasted due to undesired circuit operation so that the reduction of the current consumption can not be achieved sufficiently.

Further, the stopping of operation of the redundancy address judging circuit 300 is performed by interrupting a propagation path of a start signal transmitted from a row start trigger circuit. Apart from the above, a row address which constitutes an object of the redundancy judgment is inputted into the redundancy address judging circuit 300. This row address is inputted to the redundancy address judging circuit 300 irrespective of the presence or the absence of the start signal from the row start trigger circuit and hence, there is a possibility that corresponding to the transition of the row address, an input stage circuit of the redundancy address judging circuit 300 is driven. When the input stage circuit is operated irrespective of the presence or the absence of the operation of the redundancy address judging circuit 300, the current is wasted due to the undesired circuit operation so that there arises a problem that the reduction of the current consumption can not be achieved sufficiently.

In Japanese Laid-open Patent Publication No. 5-307898, with respect to the surplus comparing/selection circuit 100, it is possible to save the power consumption by cutting the fuse element F100 thus stopping the inflow of current into the output node N100. However, although the charge/discharge current to the output node N100 can be reduced by interrupting a supply path of a driving voltage to the output node N100, the charge/discharge current of the gate electrodes of transistors Q110 to Qn20 to which the output node N100 discharges cannot be reduced thus also giving rise to a problem. Particularly, it is necessary to input two complementary signals for every address bit to the gate electrodes of the transistors Q110 to Qn20. Further, also considering the circumstance that the number of address bits has been increased along with the progress of large capacity of the recent semiconductor memory device, the number of transistors Q110 to Qn20 has been increasing. Accordingly, the number of drain terminals of the transistors Q110 to Qn20 which are connected to an output node N100 is increased so that a junction capacitance added to the output node N100 is increased. Further, since this load capacitance has to be discharged within a predetermined time by at least one transistor, the transistors Q110 to Qn20 are required to have the sufficient driving ability whereby the size of the transistor is increased inevitably. From the above, the junction capacitance applied to the output node N100 is increased. Still further, the gate capacitance is also increased and this causes a problem that the gate charge/discharge current at the time of driving the transistors Q110 to Qn20 is increased thus giving rise to a problem.

Further, the comparing/selecting unit disclosed in Japanese Laid-Open Patent Publication No. 5-307898 precharges the output node N100 by preliminarily supplying a driving voltage to the output node N100. Then, when the input address code does not coincide with the stored defective cell address by cutting of the fuse element F110 to Fn20, the driving voltage of the output node N100 is discharged. The number of discharge paths of the output node N100 varies corresponding to the number of uncut fuse elements. That is, the number of discharge paths of the output node N100 varies from one path to the number of paths which correspond to the number of bits which constitute all input address codes. Accordingly, depending on the number of discharge paths, the discharge time of the output node N100 differs so that there arises irregularities with respect to the redundancy judging time. That is, the pre-charge state indicates the redundancy state and it is necessary to perform the dynamic operation in which the result of judgment is determined based on bred at a suitable timing after the lapse of discharge time through the discharge paths. There is no other way but to make this suitable timing match the discharge time at one path which constitutes the most delayed condition. Further, a predetermined timing tolerance must be added by taking irregularities of the semiconductor memory devices into consideration. These operations necessitate an undesired time before performing the redundancy judgment thus giving rise to a problem from a viewpoint of rapid operation. Accordingly, there has been desired the low current consumption at the redundancy judging circuit based on the static logic operation which can be operated with fixed times and can perform the redundancy judgment at the shortest timing.

Further, the reduction of power consumption at the time of refreshing operation is performed by the refreshing redundancy. However, to realize the refreshing redundancy, a larger number of auxiliary memory cells and a larger number of redundancy judging circuits become necessary. Further, it is a rare case that all of these auxiliary memory cells and redundancy judging circuits are used. Accordingly, only the redundancy judging circuits are operated while a large number of auxiliary memory cells remain unused so that there arises a problem that the undesired current consumption generated by the operation of these circuits is increased.

For example, in a synchronous type DRAM (hereinafter referred to as "SDRAM") of 128 megabits, 256 units of auxiliary memory cells are present. Here, usually, the memory cell array section 1100 is controlled such that the section 1100 is divided into a plurality of memory cell blocks, wherein 256 units of auxiliary memory cells and the redundancy judging circuits are also arranged in a distributed manner for every memory cell block. Accordingly, the judgment of redundancy is performed with respect to respective memory cell blocks. On the other hand, the cells having defective characteristics (MC2 and the like) and the defective cells (MC1 and the like) are distributed irrelevant to the respective memory cell blocks. Accordingly, in performing the usual relieving of defective memory cells using the auxiliary memory cells, it is a rare case that all auxiliary memory cells are used. That is, the average use rate at an initial stage of the manufacturing process installation is, for example, approximately 50%. This implies that 128 units of redundancy judging circuits perform the undesired circuit operations thus giving rise to a problem that a large amount of current is wasted.

Further, along with the enhancement of the yield rate which is brought about by the progress of optimization of the manufacturing process, the use rate of the auxiliary memory cells is lowered thus giving rise to a problem that the increase of current consumption caused by the undesired circuit operation of the redundancy judging circuits is further accelerated.

SUMMARY OF THE INVENTION

The present invention has been made to solve the above-mentioned problems of the prior arts and it is an object of the present invention to provide a semiconductor memory device and a redundancy judging method which can reduce current consumption at the time of performing a static-type redundancy judging operation.

To achieve the above-mentioned object, according to one aspect of the present invention, there is provided a semiconductor memory device including at least one redundancy judging circuit, the redundancy judging circuit comprising: a redundancy setting section in which the presence or the absence of substitute to auxiliary memory cells is set, a plurality of comparing sections which compare inputted address information and redundancy address information to be substituted to the auxiliary memory cells for every bit based on an EXCLUSIVE-OR control which is constituted of a combinational logic circuit, a logic composing section which performs a logic operation of output signals from the comparing sections by combinational logic circuits and judges the accordance/discordance of the address information and the redundancy address information, and a logic fixing section which fixes at least one of output signals from the comparing sections to a predetermined logic level, wherein based on a non-redundancy setting signal from the redundancy setting section which indicates absence of substitute setting, the comparing sections are inactivated so that the comparing operation is stopped and the logic fixing section is activated.

In a redundancy judging method of a semiconductor memory device according to one aspect of the present invention, in case presence of substitute to auxiliary memory cells is set with respect to memory cells of a predetermined address, inputted address information and redundancy address information to be changed to the auxiliary memory cells are compared to each other for every bit based on an EXCLUSIVE-OR control which is constituted of a combinational logic, and comparison results obtained by the comparison operation are subjected to a logic operation based on combinational logic and the accordance/discordance of the address information and the redundancy address information is judged thus performing the redundancy judgment whether the change to the auxiliary memory cells is to be executed or not, and in case absence of substitute is set, the comparison operation is stopped and at least one of the comparison results is set to a predetermined value so that the redundancy judging result of absence of substitute to the auxiliary memory cells is obtained.

Here, the non-redundancy setting signal is a signal from the redundancy setting section and is a signal which is activated when the memory cells of predetermined addresses are not substituted to the auxiliary memory cells. The signal level in the activated state may be constituted of either a positive logic as a high logic level signal or a negative logic as a low logic level signal.

Accordingly, with respect to the redundancy judging unit such as the redundancy judging circuit or the redundancy judging method in which the redundancy judgment which discriminates the accordance of the address information and the redundancy address information is performed such that the address information and the redundancy address information are subjected to the comparing operation for every bit by performing the EXCLUSIVE-OR control using the combinational logic circuit or other combinational logic and, thereafter, the comparison results are subjected to the logic operation using the combinational logic circuit or other combinational logic whereby the redundancy judgment can be performed in a static manner, when there is absence of substitution to the auxiliary memory cells due to the non-redundancy setting signal or the like, the comparing units such as comparing sections or the comparing processes for each redundancy judging unit is inactivated individually so that the comparing operation is stopped at an initial stage of the redundancy judging operation.

Accordingly, the operations of the comparing units such as comparing sections or the comparing processes and the logic composing section at subsequent stage or the logic composing unit such as the judging process of accordance/discordance are stopped for each redundancy judging unit so that the undesired current consumption can be reduced.

Simultaneously, in the redundancy judging unit whose operation is stopped, at least one comparing result thereof is fixed to a predetermined value such as a predetermined logic level value and hence, the judging result indicating the discordance is outputted from this redundancy judging unit. Here, to perform the fixing of the comparing result to the predetermined logic level, it may be sufficient to provide at least one logic fixing unit such as a logic fixing section or a setting process. Even when the operation of the comparing unit is stopped, due to the necessity of the minimum logic fixing unit, the redundancy judgment indicating the discordance can be obtained so that the current consumption caused by the operation of the logic fixing unit can be reduced to the necessity of the minimum amount.

In a semiconductor memory device in which a plurality of auxiliary memory cells which are individually subjected to the substitute control for respective different redundancy judging unit are present, only redundancy judging unit which is subjected to the substitute setting can be operated so that the current consumption caused by the redundancy judging operation can be reduced to the necessity of the minimum amount.

Since individual comparing unit is also constituted of combinational logic circuit or the like, different from the dynamic-type constitution of the prior art, the input load of terminals to which respective bits of address information are inputted is small. The driving current for the input load caused along with the transition of the address information is also small whereby the current consumption reduction effect which is brought about by limiting the redundancy judging unit to be operated can be enhanced.

In the DRAM or the like which is used in the portable equipment, it is possible to reduce the current consumption caused by the redundancy judging unit during the refreshing operation for reducing the standby current to a limit and hence, the continuous use time characteristics at the time of battery driving can be enhanced.

When the semiconductor memory device is provided with the refreshing redundancy function, the semiconductor memory device is provided with a larger number of redundancy judging units compared to the usual DRAM or the like. In this case also, the operation of the undesired redundancy judging units can be stopped and hence, in addition to the reduction of the current consumption caused at the time of performing the refreshing operation using the refreshing redundancy function, it is also possible to reduce the current consumption caused by the redundancy judgment. The current consumption during standby time can be further reduced so that the continuous use time characteristics at the time of battery driving can be further enhanced.

Further, along with the lowering of the use rate of the auxiliary memory cells caused by the progress of optimization of the manufacturing process, the frequency of redundancy judgment is reduced so that the number of the undesired redundancy judging units are increased. Since the operations of these redundancy judging units can be individually stopped, it is possible to effectively reduce the current consumption of the semiconductor memory device in response to the use rate of the auxiliary memory cells.

Furthermore, according to another aspect of the present invention, there is provided a semiconductor memory device including at least one redundancy judging circuit, the redundancy judging circuit comprising: a redundancy setting section in which the presence or the absence of substitute to auxiliary memory cells is set, a plurality of comparing sections which compare inputted address information and redundancy address information to be substituted to the auxiliary memory cells for every bit based on an EXCLUSIVE-OR control which is constituted of a combinational logic circuit, a logic composing section which performs a logic operation of output signals from the comparing sections by combinational logic circuits and judges the accordance/discordance of the address information and the redundancy address information, and an input setting section which supplies input signals of a predetermined logic level in place of respective bit signals of address information to at least one of the comparing sections, wherein based on a non-redundancy setting signal from the redundancy setting section which indicates that the absence of substitute is set, the input setting section is activated.

In a redundancy judging method of a semiconductor memory device according to another aspect of the present invention, in case presence of substitute to auxiliary memory cells is set with respect to memory cells of a predetermined address, inputted address information and redundancy address information to be substituted to the auxiliary memory cells are compared to each other for every bit based on an EXCLUSIVE-OR control which is constituted of combinational logic, and comparison results obtained by the comparison operation are subjected to a logic operation based on combinational logic and the accordance/discordance of the address information and the redundancy address information is judged thus performing the redundancy judgment whether the change to the auxiliary memory cells is to be executed or not, and in case absence of substitute is set, the address information is set to a predetermined value so that the redundancy judging result of absence of substitution to the auxiliary memory cells is obtained.

Accordingly, with respect to the redundancy judging unit such as the redundancy judging circuit or the redundancy judging method in which the redundancy judgment which judges the accordance judgment of the address information and the redundancy address information is performed such that the address information and the redundancy address information are subjected to the comparing operation for every bit by performing the EXCLUSIVE-OR control using the combinational logic circuit or other combinational logic and, thereafter, the comparison results are subjected to the logic operation using the combinational logic circuit or other combinational logic whereby the redundancy judgment can be performed in a static manner, when there is absence of substitute to the auxiliary memory cells due to the non-redundancy setting signal or the like and the redundancy judgment is unnecessary, the inputting of the address information to at least one comparing units such as comparing sections or comparing processes for each redundancy judging unit is interrupted. Then, at least one input setting units such as input setting sections, input setting processes or predetermined value supplying processes are activated so that predetermined values such as predetermined logic levels or the like are set in place of respective bit signals of address information.

Accordingly, due to respective bit signal of address information whose logic levels is fixed, the operation ranging from the operation of the comparing unit to operation of the logic composing unit in a subsequent stage such as logic composition section or the judging process of accordance/discordance are stopped for every redundancy judging unit so that the undesired current consumption can be reduced.

Here, in case the input setting units are provided to all comparing units, respective bit signals of address information are not connected to input loads of the comparing units and hence, an undesired driving current is not consumed with respect to the transition of the address information. Further, to obtain the comparison result of discordance, it is unnecessary to fix the inputs to all comparing units to a predetermined value such as a predetermined logic level or the like. That is, it is sufficient if at least one input setting unit is provided and the comparison result of discordance can be obtained with respect to at least one bit signal whereby the current consumption caused by the input setting unit can be reduced to the necessity of the minimum amount.

In a semiconductor memory device in which a plurality of auxiliary memory cells which are individually subjected to the substitute control for respective different redundancy judging unit are present, only redundancy judging unit which is subjected to the change setting can be operated so that the current consumption caused by the redundancy judging operation can be reduced to the necessity of the minimum amount.

Since individual comparing unit is also constituted of combinational logic circuit or the like, different from the dynamic-type constitution of the prior art, the input load of terminals to which respective bits of address information are inputted is small. The driving current for the input load caused along with the transition of the address information is also small whereby the current consumption reduction effect which is brought about by limiting the redundancy judging unit to be operated can be enhanced.

Further, with respect to the redundancy judging unit which is served for absence of substitution to the auxiliary memory cells, due to the input setting unit, the input of address information is interrupted and a predetermined logic level or the like is set in place of respective bit signal of address information and hence, the address information is not inputted to the comparing unit. Accordingly, even when the address information is changed, the comparing unit constituting the input stage of the redundancy judging unit which does not perform the redundancy judgment is not operated and hence, the undesired current consumption can be reduced.

In the DRAM or the like which is used in the portable equipment, it is possible to reduce the current consumption caused by the redundancy judging unit during the refreshing operation for reducing the standby current to a limit and hence, the continuous use time characteristics at the time of battery driving can be enhanced.

When the semiconductor memory device is provided with the refreshing redundancy function, the semiconductor memory device is provided with a larger number of redundancy judging units compared to the usual DRAM or the like. In this case also, the operation of the undesired redundancy judging units can be stopped and hence, in addition to the reduction of the current consumption caused at the time of performing the refreshing operation using the refreshing redundancy function, it is also possible to reduce the current consumption caused by the redundancy judgment. The current consumption during standby time can be also reduced so that the continuous use time characteristics at the time of battery driving can be further enhanced.

Further, along with the lowering of the use rate of the auxiliary memory cells caused by the progress of optimization of the manufacturing process, the frequency of redundancy judgment is reduced so that the number of the undesired redundancy judging units are increased. Since the operations of these redundancy judging units can be individually stopped, it is possible to effectively reduce the current consumption of the semiconductor memory device in response to the use rate of the auxiliary memory cells.

The above and further objects and novel features of the invention will more fully appear from the following detailed description when the same is read in conjunction with the accompanying drawings. It is to be expressly understood, however, that the drawings are for the purpose of the illustration only and are not intended as a definition of the limits of the invention.

DETAILED DESCRIPTION OF THE PREFERRED EMBODIMENTS

Embodiments which specifically describe a semiconductor memory device and a redundancy judging method of a semiconductor memory device of the present invention are explained in detail in conjunction with attached drawings hereinafter.

Figure 1:
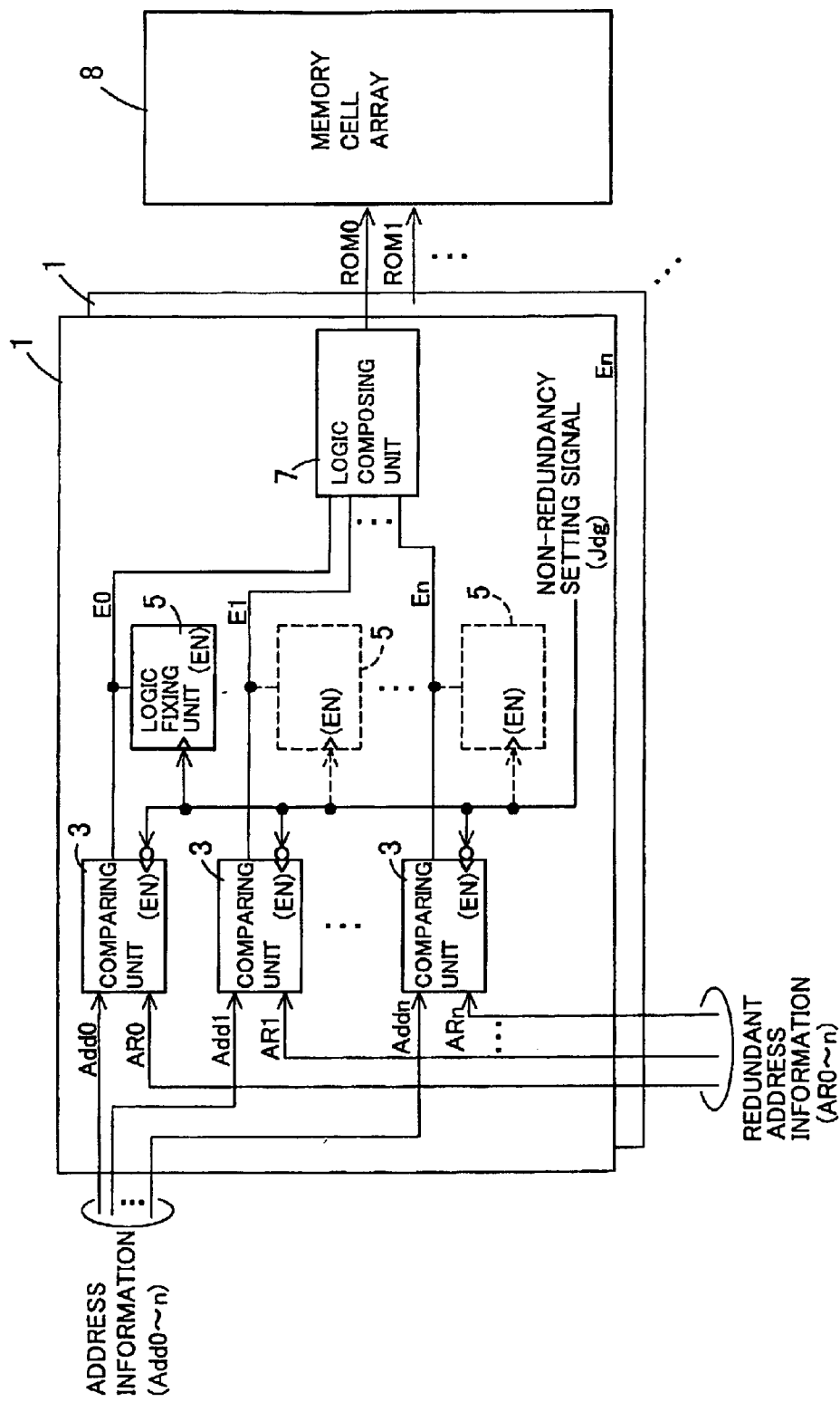
FIG. 1 is a constitutional view showing the constitution of the first principle with respect to the redundancy judgment of the present invention.

FIG. 1 is a constitutional view for explaining the first principle. A semiconductor memory device includes a memory cell array 8 and a plurality of redundancy judging units 1 such as redundancy judging circuits or redundancy judging methods which collectively select auxiliary memory cells provided to the memory cell array 8 as blocks for every predetermined number, wherein the auxiliary memory cells of each block are selecting by a selecting signal ROM0, ROM1 or the like.

Each redundancy judging unit 1 is provided with comparing units 3 which are constituted of combinational logic circuits or other combinational logics. In each comparing unit 3, bit signals Add0–n which constitute address information and bit signals AR0–n which constitute redundancy address information are compared to each other based on an EXCLUSIVE-OR control for every bit (Add0 and AR0, Add1 and AR1, Addn and ARn and the like). Then, comparison results E0–n are subjected to a logic operation by logic composing unit 7 using a combinational logic circuit or other combinational logic so that the selecting signal ROM0, ROM1 or the like is outputted.

Here, each comparing unit 3 is provided with activating section EN and the activation state of the comparing unit 3 is controlled in response to a non-redundancy setting signal Jdg. That is, for example, when the change setting to the auxiliary memory cells is not performed, the non-redundancy setting signal Jdg is set in high logic level. Since the activation section EN is controlled based on an inverted logic, each comparing unit 3 is inactivated and the operation thereof is stopped.

Further, respective comparison results E0–n are connected to logic fixing unit 5 provided with activating section EN and the activation state of the logic fixing unit 5 is controlled in response to the non-redundancy setting signal Jdg in the same manner as the comparing unit 3. The logic fixing unit 5 is activated in response to the non-redundancy setting signal Jdg of high logic level and respective comparison results E0–n are fixed to a predetermined value such as a predetermined logic level or the like. This predetermined logic level or the like is a value which indicates the discordance of the comparison results E0–n and hence, the logic composing section 7 discriminates that the address information and the redundancy address information discord with each other. Here, the accordance judgment necessitates that all bit signals which constitute the address information accord with respective bit signals of the redundancy address information. Accordingly, by fixing at least 1 bit among the comparison results E0–n to a predetermined logic level, it is possible to obtain the discordance judgment from the logic composing section 7. That is, it is sufficient for the logic fixing unit 5 when the logic fixing unit 5 is provided to at least one bit of the comparison result E0–n.

Here, the non-redundancy setting signal Jdg is a signal which is outputted from redundancy setting unit such as a redundancy setting section or a redundancy setting process (not shown in the drawing) which is provided to each redundancy judging unit 1. Accordingly, when the semiconductor memory device includes a plurality of redundancy judging unit 1, a plurality of auxiliary memory cells which are subjected to the change control for respective redundancy judging unit 1 are present. However, also in this case, it is possible to make only the redundancy judging unit 1 which are subjected to the change setting perform the redundancy judging operation so that the undesired redundancy judging operation can be stopped.

Figure 2:
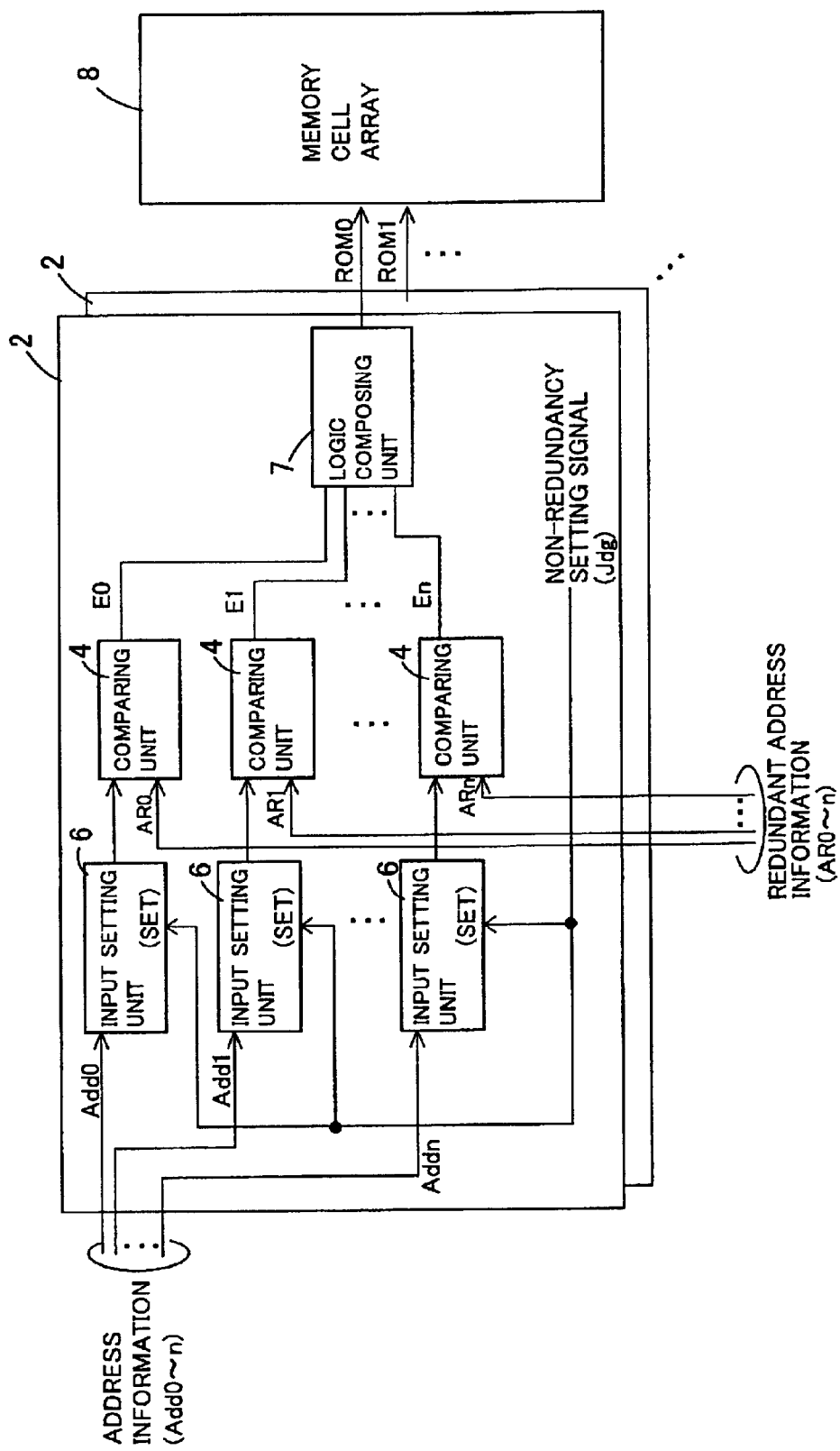
FIG. 2 is a constitutional view showing the constitution of the second principle with respect to the redundancy judgment of the present invention.

FIG. 2 is a constitutional view for explaining the second principle. A semiconductor memory device includes a memory cell array 8 and a plurality of redundancy judging units 2 such as redundancy judging circuits or redundancy judging methods which collectively select auxiliary memory cells provided to the memory cell array 8 as blocks for every predetermined number, wherein the auxiliary memory cells of each block are selected by a selecting signal ROM0, ROM1 or the like.

In each redundancy judging unit 2, different from the constitution of the first principle shown in FIG. 1, comparing unit 4 which is constituted of a combinational logic circuit or other combinational logic is not provided with activating section EN so that the comparison operation is always performed. In the constitution of the second principle, in place of the logic fixing unit 5 employed in the constitution of the first principle, input setting unit 6 are provided to supply paths which supply bit signals Add0–n of address information to respective comparing unit 4 and setting unit SET which supply a predetermined value such as a predetermined logic level or the like to respective comparing unit 4 are provided to respective input setting unit 6. Anon-redundancy setting signals Jdg is supplied to the setting unit SET so that outputs of the input setting unit 6 are controlled. For example, when the non-redundancy setting signal Jdg is set in high logic level, a predetermined logic level is supplied to respective comparing unit 4. Since the predetermined logic level or the like is a value which accords with neither bit signals AR0–n of the redundancy address information nor bit line signals Add-n of the address information, respective comparison results E0–n from respective comparing unit 4 indicate the comparison discordance whereby the logic composing section 7 discriminates that the address information and the redundancy address information discord with each other.

Here, the non-redundancy setting signal Jdg is a signal which is outputted from redundancy setting unit such as a redundancy setting section or a redundancy setting process (not shown in the drawing) which is provided to each redundancy judging unit 2. Accordingly, when the semiconductor memory device includes a plurality of redundancy judging unit 2, a plurality of auxiliary memory cells which are subjected to the change control for respective redundancy judging unit 2 are present. However, also in this case, it is possible to make only the redundancy judging unit 2 which are subjected to the change setting perform the redundancy judging operation so that the undesired redundancy judging operation can be stopped.

Hereinafter, the specified redundancy judging circuits of the first and second embodiments are illustrated based on the constitutional views of the first and second principles. Prior to the explanation of the first and second embodiments, a circuit constitutional example which is constituted of comparing units 3, 4 and a combinational logic circuit as a specific example of logic composing section 7 are shown.

Figure 3:
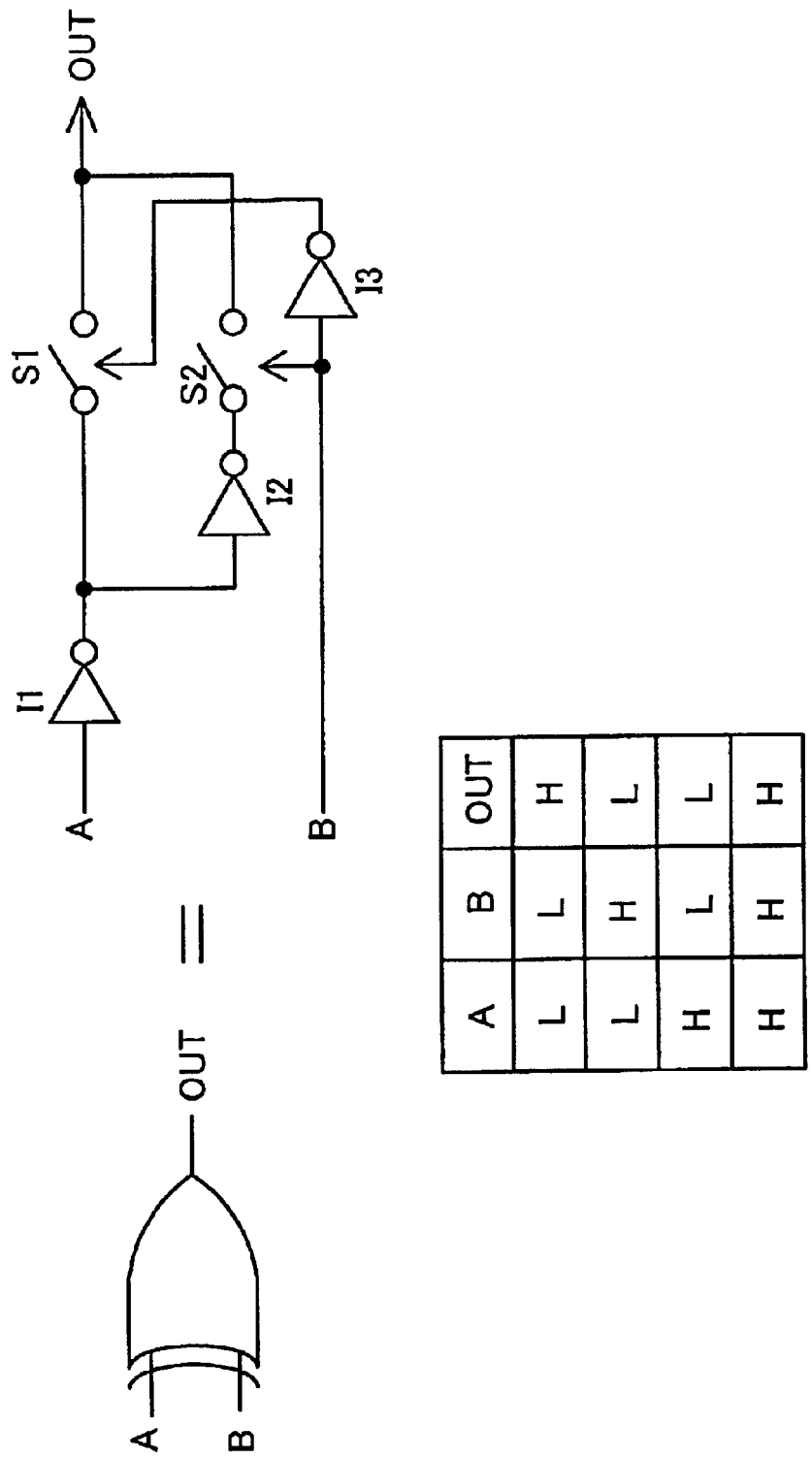
FIG. 3 is a circuit diagram showing a specific example of a comparing section which performs the accordance comparing with respect to bit signals of address information and redundancy address information.

FIG. 3 is an example of a circuit in which the EXCLUSIVE-OR control in the comparing units 3, 4 is performed by a combinational logic circuit. Since the comparing units 3, 4 are constituted of the combinational logic circuit, an output signal OUT is controlled in a static manner with respect to input signals A, B.

The input signal A is inputted to a switching element S1 as an anti-phase signal through an inverter gate I1 and also is inputted to a switching element S2 as an in-phase signal through an inverter gate I2. Other ends of the switching elements S1, S2 are connected in common and output an output signal OUT. The input signal B directly controls the opening/closing of the switching element S2 as an in-phase signal and is inverted into an anti-phase signal by an inverter gate 13 and performs the opening/closing control of the switching element S1. Here, the opening/control of the switching elements S1, S2 is configured to be performed by a positive logic and the switching elements S1, S2 become conductive with a signal of high logic level (H).

That is, when the input signal B is the high-logic level signal (H), the switching element S1 is opened and the switching element S2 becomes conductive. The in-phase signals obtained from the input signal A through two inverter gates 11, 12 constitute the output signal OUT. When the input signal A is a low-logic level signal (L) with respect to the high-logic level signal (H) of the input signal B, the output signal OUT outputs a low-logic level signal (L) because the comparison result shows the discordance, while the input signal A is a high-logic level signal (H) with respect to the high-logic level signal (H) of the input signal B, the output signal OUT outputs a high-logic level signal (H) because the comparison result shows the accordance. To the contrary, when the input signal B is the low-logic level signal (L), the switching element S1 becomes conductive and the anti-phase signal which is obtained from the input signal A through one inverter gate I1 constitutes the output signal OUT. When the input signal A is the low-logic level signal (L) with respect to the low-logic level signal (L) of the input signal B, the output signal OUT outputs a high-logic level signal (H) because the comparison result shows the accordance, while when the input signal A is the high-logic level signal (H) with respect to the low-logic level signal (L) of the input signal B, the output signal OUT outputs a low-logic level signal (L) because the comparison result shows the discordance.

Figure 4:
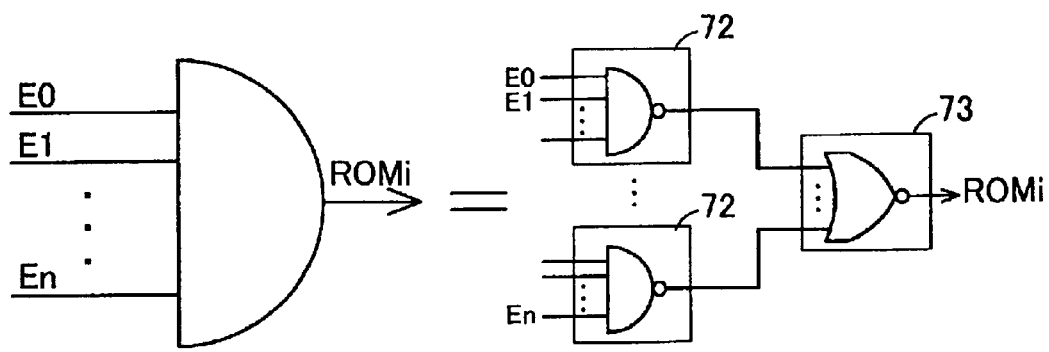
FIG. 4 is a circuit diagram showing a specific example of a logic composing section.

FIG. 4 shows an example of a circuit in which logic composing section 7 is constituted of a combinational logic circuit. Since the composing section 7 is constituted of the combinational logic circuit, an output signal ROMi is controlled in a static manner with respect to the input signals E0–$n$.

In the logic composing section 7, a logic operation is performed with respect to respective comparison results E0–$n$ from respective comparing units 3, 4, the judgment is performed whether respective bit signals Add0–$n$ of the address information accord with respective bit signals AR0–$n$ of the redundancy address information and, thereafter, the judgment is performed whether the input address information is to be changed to the redundancy address information or not. In FIG. 4, the logic composing unit 7 is configured such that when all comparison results E0–$n$ accord with each other, the selecting signal ROMi which instructs the change into the auxiliary memory cells is outputted. That is, as the logic operation, the CONJUNCTION is adopted. Although the CONJUNCTION operation can be constituted of one logic gate in principle, respective comparison results ER0–$n$ which constitute input signals are present in number corresponding to the number of bit signals (0–$n$) which constitute the address information and the redundancy address information and hence, the comparison results ER0–$n$ form the multiple inputting. Further, along with the increase of demand for large capacity of the semiconductor memory device, the number of bits which constitute the address information is increased and hence, there is observed a tendency that the number of inputs is increasing.

To constitute the logic operation of multiple inputting using one logic gate makes the constituent transistors large-sized and hence, the logic operation is not realistic from a viewpoint of current consumption and the occupying area. Accordingly, the logic operation of multiple inputting is generally constituted of a logic gate in multiple stages. In FIG. 4, the logic gate constitution of two stages is adopted wherein in performing the CONJUNCTION operation, the partial CONJUNCTION operation is performed using first logic composing sections 72 each of which is constituted of a NAND gate which collectively arranges a predetermined number of comparison results as a block and, thereafter, the result of the logic operation is collectively arranged by a second logic composing section 73 constituted of a NOR gate thus obtaining a selecting signal ROMi.

Figure 5:
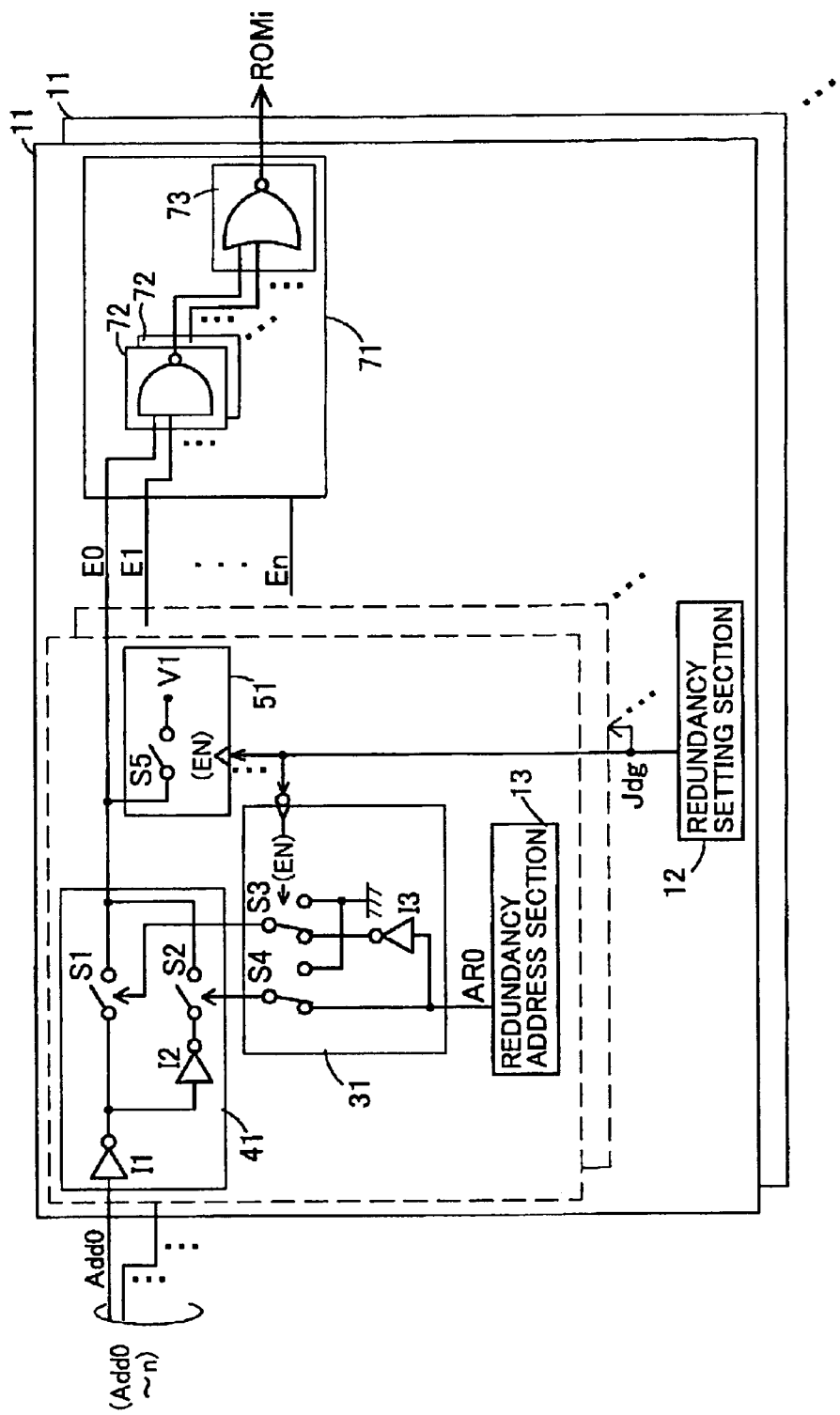
FIG. 5 is a circuit diagram showing a redundancy judging circuit of the first embodiment.

Subsequently, an embodiment of the redundancy judging circuit is explained. FIG. 5 shows the redundancy judging circuit 11 of the first embodiment. With respect to a section (dotted line section in FIG. 5) for performing comparing processings which are provided to respective bits corresponding to the address information and the redundancy address information, although a circuit constitution for the bit signal Add0 is shown as a typical example, it is needless so say that other bit signals Add1-$n$ have the same circuit constitution.

Each comparison results E0–$n$ are subjected to the CONJUNCTION operation by the logic composing section 71 which is constituted of the first logic composing section 72 and the second logic composing section 73. When the address information and the redundancy address information accord with each other, the selecting signal ROMi which instructs the change to the auxiliary memory cells with respect to the memory cell corresponding to the inputted address information is outputted.

As a pre-stage thereof, the change setting which discriminates whether the change to the auxiliary memory cells which respective redundancy judging circuits 11 administrate is performed or not is stored in the redundancy setting sections 12 which are provided to the respective redundancy judging circuits 11. The non-redundancy setting signal Jdg is outputted from the redundancy setting section 12. When the change setting is performed, the non-redundancy setting signal Jdg in low-logic level is outputted and hence, the judgment operation of the redundancy judging circuit 11 is performed so that the selecting signal ROMi of high logic level is outputted with respect to the address information to be changed. When the change setting is not performed, the non-redundancy setting signal Jdg in high-logic level is outputted and hence, the judgment operation of the redundancy judging circuit 11 is stopped so that the selecting signal ROMi of low logic level is outputted irrespective of the presence of the address information.

Since the non-redundancy setting signal Jdg is a logic level signal, by suitably adjusting the logic level, it is possible to perform the similar execution/stopping operations of the judging operation by inputting the non-redundancy setting signal Jdg to the second logic composing section 73. However, according to the present invention, the non-redundancy setting signal Jdg is not inputted to the subsequent stage logic composing section 73 but is inputted to the precedent stage comparing processing executing section (dotted section in FIG. 5). This provision is provided for reducing the undesired circuit operation as much as possible when the operation of the redundancy judging circuit 11 is stopped.

In the section which performs the comparing processing (dotted section shown in FIG. 5), the combinational logic circuit shown in FIG. 3 which performs the EXCLUSIVE-OR control is comprised of a comparison-core section 41 and an inverter gate 13 in a switching control section 31. Into the switching control section 31 which is present in an input path of a bit signal AR0 of the redundancy address information and controls switching elements S1, S2 of the comparison-core section 41, a bit signal AR0 of the redundancy address information stored in the redundancy address section 13 is inputted. The bit signal AR0 is directly inputted to a switching element S4 as an in-phase signal and, at the same time, the bit signal AR0 is inputted to a switching element S3 through the inverter gate 13 as an anti-phase signal. Further, here provided is a logic fixing section 51 which connects the comparison result E0 of the comparison-core section 41 to a voltage source V1 indicative of a predetermined logic level through a switching element S5.

When the non-redundancy setting signal Jdg is inputted as a control signal of low logic level to the switching elements S3, S4 of the switching control section 31 through an activation terminal EN, the complementary bit signal AR0 is applied to the switching elements S3, S4 and hence, the switching control is performed. Further, when the non-redundancy setting signal Jdg is inputted as a control signal of high logic level to the switching element S5 of the logic fixing section 51 through the activation terminal EN, the comparison result E0 is fixed to the voltage value V1 of a predetermined logic level.

When the change setting is performed, the signal of low logic level is outputted as the non-redundancy setting signal Jdg and hence, the switching elements S3, S4 of the switching control section 31 control the switching elements S1, S2 of the comparison-core section 41 using the bit signal AR0 of the redundancy address information and an anti-phase signal thereof as complementary signals. Accordingly, the comparing section which includes the comparison-core section 41 and the inverter gate 13 is operated so that the comparison result E0 between the bit signal Add0 of the address information and the bit signal AR0 of the redundancy address information is outputted. Here, the non-redundancy setting signal Jdg of low logic level inactivates the logic fixing section 51 and hence, there is no possibility that the comparison result E0 is fixed to the predetermined logic level. Accordingly, the comparison of the bit signals Add0 and AR0 is performed so that the judging operation is performed by the redundancy judging circuit 11.

When the change setting is not performed, the high-logic level signal is outputted as the non-redundancy setting signal Jdg and hence, the switching elements S3, S4 of the switching control section 31 are connected to a ground potential so that both switching elements S1, S2 of the comparison-core section 41 become non-conducive and are set in an opened state whereby the comparing operation is stopped. Here, the logic fixing section 51 is activated and the comparison result E0 is fixed to the voltage value V1 indicating a predetermined logic level. This voltage value V1 accords with logic level when the comparison result at the comparing section indicates the discordance and hence, the comparison result E0 shows the comparison discordance. In performing the accordance comparison between the address information and the redundancy address information, it is necessary to make these all bit signals Add0–n accord with the bit signals AR0–n of the corresponding redundancy address information. Accordingly, by fixing the comparison result E0 to the discordance logic level using the logic fixing section 51, the redundancy judging circuit 11 discriminates the discordance so that there is no possibility that the selecting signal ROMi is outputted.

Figure 6:
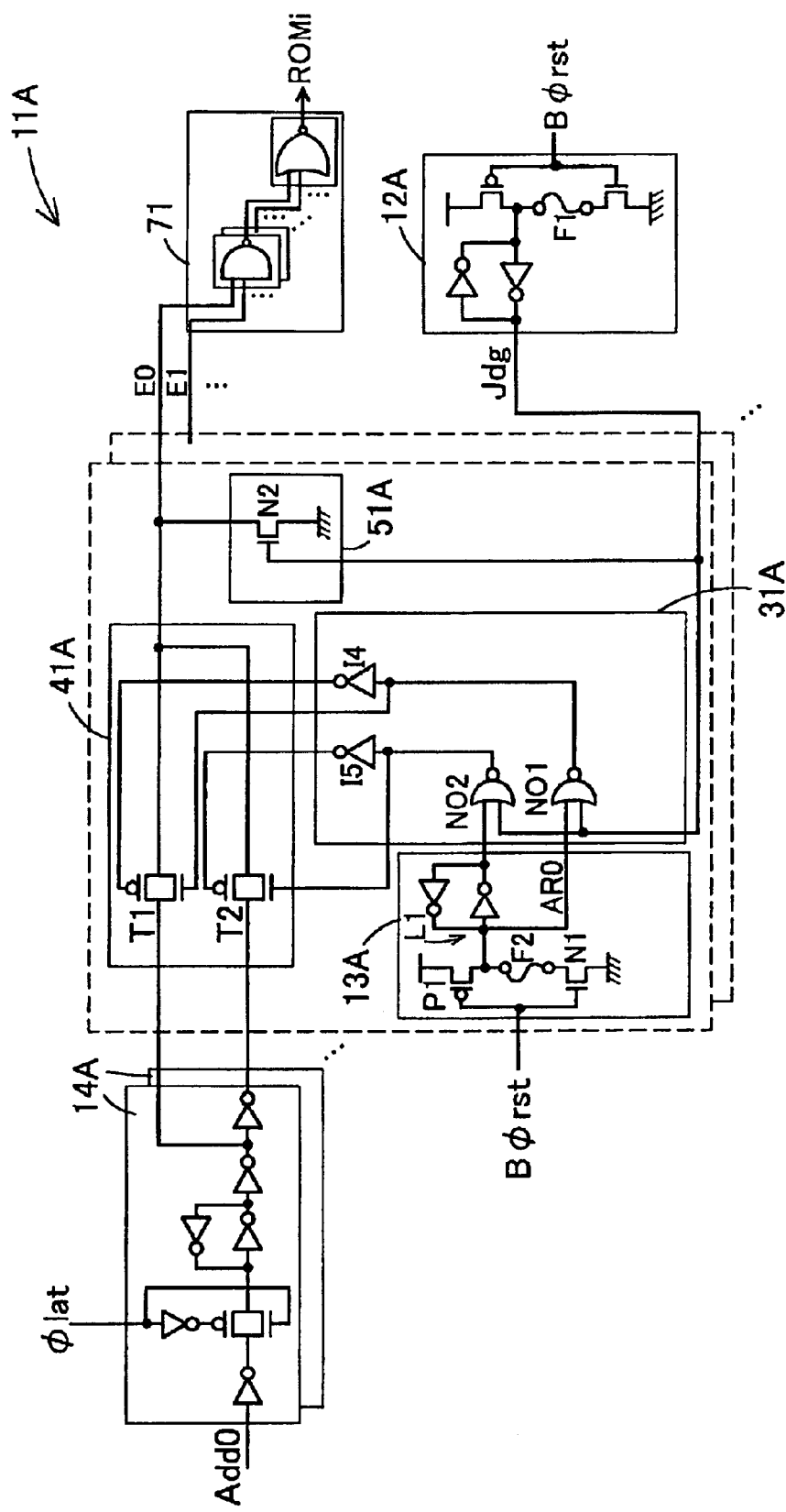
FIG. 6 is a circuit diagram showing a specific example of the redundancy judging circuit of the first embodiment.

FIG. 6 shows a redundancy judging circuit 11A of a specific example of the first embodiment. With respect to the redundancy judging circuit 11A, in an address buffer 14A, transfer gates are controlled based on an address latch signal Φlat and an address signal Add0 is fetched into a latch circuit which is constituted of inverter gates. The fetched address signal Add0 is subjected to the logic inversion and the amplification using a two-staged inverter gate and, thereafter, is outputted to a redundancy judging circuit 11A as a complementary address signal.

Since the address signal supplied to the redundancy judging circuit 11A is the complementary signal, inverter gates 11, 12 in FIG. 5 are not necessary in a comparison-core section 41A. To transfer gates T1, T2 which constitutes specific examples of the switching elements S1, S2 in FIG. 5, an anti-phase signal and an in-phase signal of the address signal Add0 are inputted.

The switching control section 31A is configured to perform the open/close control of the transfer gates T1, T2. As a specific example for realizing functions of the switching elements S3, S4 in FIG. 5, here configured is a logic operation circuit which uses a bit signal AR0 of redundancy address information, an anti-phase signal thereof and a non-redundancy setting signal Jdg as input signals. An output signal of a NOR gate NO1 which performs the NOR logic operation with respect to the bit signal AR0 and the non-redundancy setting signal Jdg is served as an NMOS transistor control signal of the transfer gate T1 and a signal obtained by inverting this signal by an inverter gate 14 is served as a PMOS transistor control signal of the transfer gate T1.

Further, in place of the bit signal AR0, using an output signal of the NOR gate NO2 to which an inverted signal of the bit signal AR0 is inputted and a signal obtained by inverting the output signal using an inverter gate IS, the open/close control of the transfer gate T2 is performed.

A logic fixing section 51A is constituted of an NMOS transistor N2 which connects a comparison result E0 and a ground potential and the non-redundancy setting signal Jdg is inputted to a gate terminal thereof. When the non-redundancy setting signal Jdg is set in high logic level and the change setting is not performed, the NMOS transistor N2 becomes conductive and the comparison result E0 is fixed to the ground potential.

A redundancy setting section 12A and a redundancy address section 13A have similar circuit constitutions. A specific circuit constitution is explained by taking the redundancy address section 13A as an example. A PMOS transistor P1 which is connected to a power source voltage and a NMOS transistor N1 which is connected to a ground potential are connected to each other through a fuse element F2. While the bit signal AR0 which constitutes an output signal is outputted from a connection between the PMOS transistor P1 and the fuse element F2, the bit signal AR0 is latched by a latch circuit L1 which is constituted of an inverter gate and an inverted signal is outputted.

When the change setting is performed in the redundancy setting section 12A and when the high logic level is set as the logic level of the bit signal of the redundancy address information in the redundancy address section 13A, fuse elements F1, F2 which are provided as memory elements are cut. To the contrary, when the change setting is not performed in the redundancy setting section 12A and when the low logic level is set as the logic level of the bit signal of the redundancy address information in the redundancy address section 13A, fuse elements F1, F2 which are provided as memory elements are not cut.

A start-up signal BΦrst is inputted to the gate terminals of the PMOS/NMOS transistors (P1, N1 in the redundancy address section 13A). The start-up signal BΦrst is a signal which supplies a pulse signal of low logic level when power is ON. When the start-up signal BΦrst is set in low logic level state, the PMOS transistor P1 becomes conductive and the output signal (the bit signal AR0 in the redundancy address section 13A) is set in the high logic level. When the supplying of the pulse signal is finished, the start-up signal BΦrst returns to the high logic level. Thereafter, the start-up signal BΦrst holds the high logic level during a period that power is ON. In such a state, the PMOS transistor P1 is turned off and the NMOS transistor N1 becomes conductive. Accordingly, unless the fuse element (F2 in the redundancy address section 13A) is cut, the output signal is discharged through the fuse element and the NMOS transistor N1 and is inverted to the low logic level. On the other hand, when the fuse element is cut, a discharge path is not formed and hence, the output signal holds the high logic level. That is, the stored information on cutting/non-cutting of the fuse element is latched in a latch circuit (L1 in the redundancy address section 13A).

In the redundancy setting section 12A, since the fuse element F1 is cut when the change setting is performed, the non-redundancy setting signal Jdg outputs the low logic level, while since the fuse element F1 is not cut when the change setting is not performed, the non-redundancy setting signal Jdg outputs the high logic level.

In the redundancy address section 13A, since the fuse element F2 is cut when the high logic level is set as the bit signal of the redundancy address information, the bit signal AR0 also outputs the high logic level, while since the fuse element F2 is not cut when the low logic level is set as the bit signal of the redundancy address information, the bit signal AR0 also outputs the low logic level. That is, the signal which has the in-phase as the bit signal which is to be set as the redundancy address information is outputted as the bit signal AR0. Here, since the non-redundancy setting signal Jdg and the bit signal AR0 differ in positions where these signals are outputted from a latch circuit, they constitute signals which are logically opposite from each other in phase.

Subsequently, the control of the transfer gates T1, T2 in the switching control section 31A is explained. When the change setting is performed, the non-redundancy setting signal Jdge of low logic level is outputted. Here, both NOR gates NO1, NO2 to which the non-redundancy setting signal Jdg is inputted as one input signal function as inverted logic gates.

Accordingly, an anti-phase signal is inputted to the gate terminal of the NMOS transistor of the transfer gate T1 from the bit signal AR0 through the NOR gate NO1 and an in-phase signal which is obtained by inverting the anti-phase signal through the inverter gate 14 is inputted to the PMOS transistor. Further, to the gate terminal of the NMOS transistor of the transfer gate T2, an in-phase signal which is obtained by inverting the bit signal AR0 by the latch circuit L1 and further by inverting the signal through the NOR gate NO2 is inputted. Further, an inverted anti-phase signal is inputted to the PMOS transistor through the inverter gate 15. Accordingly, when the bit signal AR0 is set in high logic level, the transfer gate T2 becomes conductive and a signal which has the same phase as the bit signal which constitutes the address information is outputted as the comparison result E0. That is, when the bit signal of the address information is set in the high logic level, the comparison result E0 of high logic level is obtained. When the bit signal AR0 is set in the low logic level, the transfer gate T1 becomes conductive and a signal which has the phase opposite to the bit signal which constitutes the address information is outputted as the comparison result E0. That is, when the bit signal of the address information is set in low logic level, the comparison result E0 of high logic level is obtained. The EXCLUSIVE-OR control is performed in the above-mentioned manner so that the accordance comparison of the address bit signal is performed.

On the other hand, when the change setting is not performed, the non-redundancy setting signal Jdg of high logic level is outputted. Here, both output signals of the NOR gates NO1, NO2 are fixed to the low logic level and, at the same time, both output signals of the inverter gates 14, 15 are fixed to the high logic level. That is, the input signal of low logic level is supplied to the gate terminals of both NMOS transistors which constitute the transfer gates T1, T2, while the input signal of high logic level is supplied to the gate terminals of PMOS transistors so that both transfer gates T1, T2 are turned off and is set in non-conductive state whereby a propagation path of the complementary signal from the address buffer 14A is cut and is set in the opened state. Here, the gate terminal of the logic fixing section 51A is set in high logic level so that the NMOS transistor N2 becomes conductive. Accordingly, the EXCLUSIVE-OR control operation is stopped and, at the same time, the comparison result E0 is fixed to the ground potential so that the comparison result E0 similar to that of discordance is obtained in the comparison of the address information.

As has been explained above, according to the redundancy judging circuits 11, 11A of the first embodiment, the comparison-core sections 41, 41A include the switching elements S1, S2 which select either one of complementary signals which constitute respective bit signals Add0–n of the address information by the non-redundancy setting signal Jdg or the transfer gates T1, T2 which constitute specific examples of the switching elements S1, S2 and hence, the EXCLUSIVE-OR output is obtained and the comparison operation is performed based on the EXCLUSIVE-OR output. Accordingly, by opening the propagation path of the address information by making both switching elements S1 and S2 or both transfer gates T1, T2 non-conductive and by preventing the connection thereof to any complementary signals, the comparison-core section 41, 41A are inactivated so that the comparison operation can be stopped. Since the comparing operation can be stopped in the comparison-core sections 41, 41A which constitute the initial stage of the redundancy judging operation, the operations of the comparison-core sections 41, 41A and the logic composing section 71 at the subsequent stage is stopped whereby the undesired current consumption can be reduced.

Simultaneously, due to at least one logic fixing section 51, 51A, at least one comparison result E0 is fixed to the voltage value V1 and the judging result of discordance is outputted from the redundancy judging circuit 11, 11A. The current consumption which becomes necessary for operating the logic fixing sections 51, 51A can be reduced to necessity of minimum level.

In a semiconductor memory device having a plurality of auxiliary memory cells which are individually subjected to the change control in the redundancy judging circuits 11, 11A which are different from each other, it is possible to operate only the redundancy judging circuits 11, 11A which are subjected to the change setting so that the current consumption in the redundancy judging operation can be set to the necessity of minimum level.

Further, the comparison results E0–n for respective bits from the comparison-core sections 41, 41A which are constituted of combinational logic circuits are subjected to the logic operation in the logic composing section 71 which is constituted of the combinational logic circuit so as to discriminate the accordance/discordance of the address information and the redundancy address information and hence, when the comparison result of at least any one bit is set in the logic level which indicates the discordance, it is possible to make the judgment of discordance.

Since respective comparison-core sections 41, 41A are also constituted of combinational logic circuits, the input load of respective bit signals Add0–$n$ which constitute the address information is small and hence, the current consumption reduction effect at the time of limiting the redundancy judging circuits 11, 11A to be operated can be also enhanced.

With respect to the DRAM or the like used in the portable equipment, particularly with respect to such a DRAM or the like having the refreshing redundancy function, the circuit operation of the undesired redundancy judging circuits 11, 11A can be stopped. Accordingly, in addition to the reduction of the current consumption due to the refreshing redundancy function at the time of refreshing operation, the current consumption which is caused by the redundancy judgment can be also reduced. By further reducing the current consumption during standby time, the continuous use time characteristics at the time of battery driving can be enhanced.

Further, along with the lowering of the use rate of the auxiliary memory cells, the frequency of redundancy judgment is reduced and the number of undesired redundancy judging circuits 11, 11A is increased. In this manner, when the use rate of the auxiliary memory cells is lowered, the semiconductor memory device can effectively reduce the current consumption.

Figure 7:
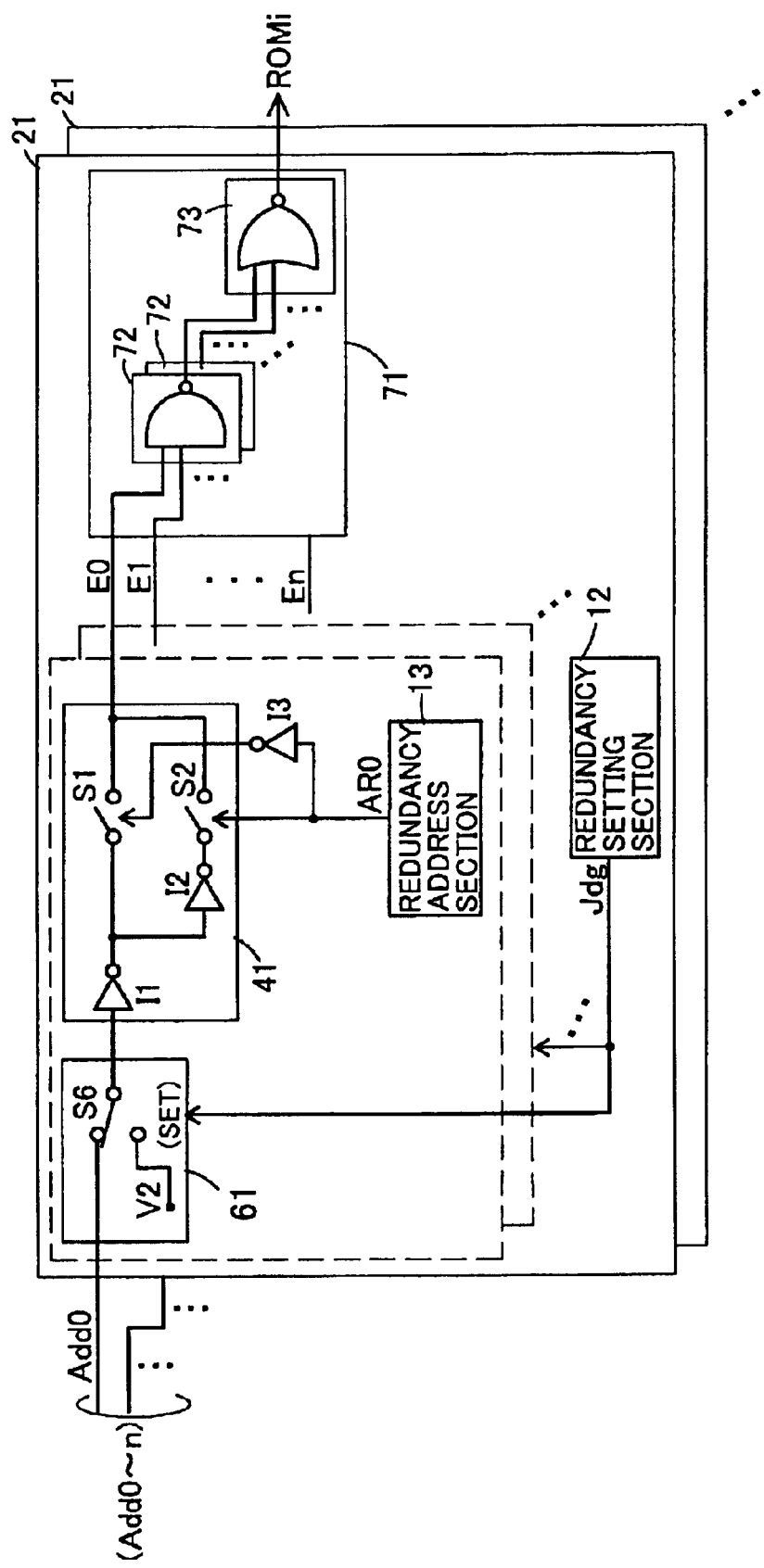
FIG. 7 is a circuit diagram showing a redundancy judging circuit of the second embodiment.

In a section which performs the comparing processing of a redundancy judging circuit 21 of the second embodiment shown in FIG. 7 (dotted section in FIG. 7), compared to the section which performs the comparing processing of the redundancy judging circuit 11 of the first embodiment (dotted section in FIG. 5), in place of the switching control section 31 excluding the inverter gate 13 and the logic fixing section 51, the section is provided with an input setting section 61 on a path leading from a bit signal Add0 of address information to a comparison-core section 41.

The input setting section 61 is provided with a switching section S6 which changes over an input terminal of the comparison-core section 41 between the bit signal Add0 and a voltage source V2 which indicates a predetermined logic level. Here, the switching section S6 is controlled based on a non-redundancy setting signal Jdg supplied from a redundancy setting section 12. With the logic level of the non-redundancy setting signal Jdg corresponding to the presence or the absence of the change setting, either one of the bit signal Add0 and the voltage value V2 is supplied to the input terminal of the comparison-core section 41. With respect to other circuit constitution, constitutional elements which are given same symbols as those constitutional elements of the redundancy judging circuit 11 of the first embodiment perform the same operation and advantageous effects and hence, their explanation is omitted in this embodiment.

In the redundancy judging circuit 21, without stopping the operation of the comparing section including the inverter gate 13 besides the comparison-core section 41 and holding the operation in the activated state, an input signal to the comparison-core section 41 which constitutes an object to be compared with the bit signal AR0 of the redundancy address information is changed over by the input setting section 61.

In the following explanation, it is assumed that, the switching element S6 of the input setting section 61 is connected to the bit signal Add0 of the address information based on a control signal of low logic level and is connected to the voltage value V2 based on a control signal of high logic level. Assume that the non-redundancy judging signal Jdg becomes a low-logic signal when the change setting is performed, the switching element S6 is connected to the bit signal Add0 of the address information and hence, the bit signal Add0 is inputted to the comparison-core section 41 whereby the comparing operation is performed between the bit signal Add0 of the address information and the bit signal AR0 of the redundancy address information and the comparison result E0 is outputted. Then, the redundancy judging circuit 21 performs the judging operation.

When the change setting is not performed, the non-redundancy judging signal Jdg becomes the high-logic level signal and hence, the switching element S6 is connected to the voltage value V2. Accordingly, the voltage value V2 is inputted to the comparison-core section 41 and the comparing operation is performed between the voltage value V2 and the bit signal AR0 of the redundancy address information. By setting the voltage value V2 to a logic level different from the logic level of the bit signal AR0 of the redundancy address information when the change setting is not performed, the comparison result E0 always indicates the comparison discordance and hence, the redundancy judging circuit 21 discriminates the discordance and there is no possibility that a selecting signal ROMi is outputted. To be more specific, when the bit signals AR0–$n$ output the low-logic level, the voltage value V2 is set to a voltage value indicative of high logic level.

Here, when the input setting sections 61 are provided to all comparison-core sections 41, respective bit signals Add0–$n$ of address information are not connected to input loads of the comparison-core sections 41 and hence, an undesired driving current of input load is not consumed with respect to the transition of the address information. Further, to obtain the comparison result of discordance, it is unnecessary to fix the inputs to all comparison-core sections 41 to the voltage value V2. That is, it is sufficient if at least one input setting section 61 is provided and the comparison results E0–$n$ of comparison discordance can be obtained with respect to at least one of bit signals AR0–$n$ whereby the current consumption caused by the input setting section 61 can be reduced to the necessity of the minimum amount.

Figure 8:
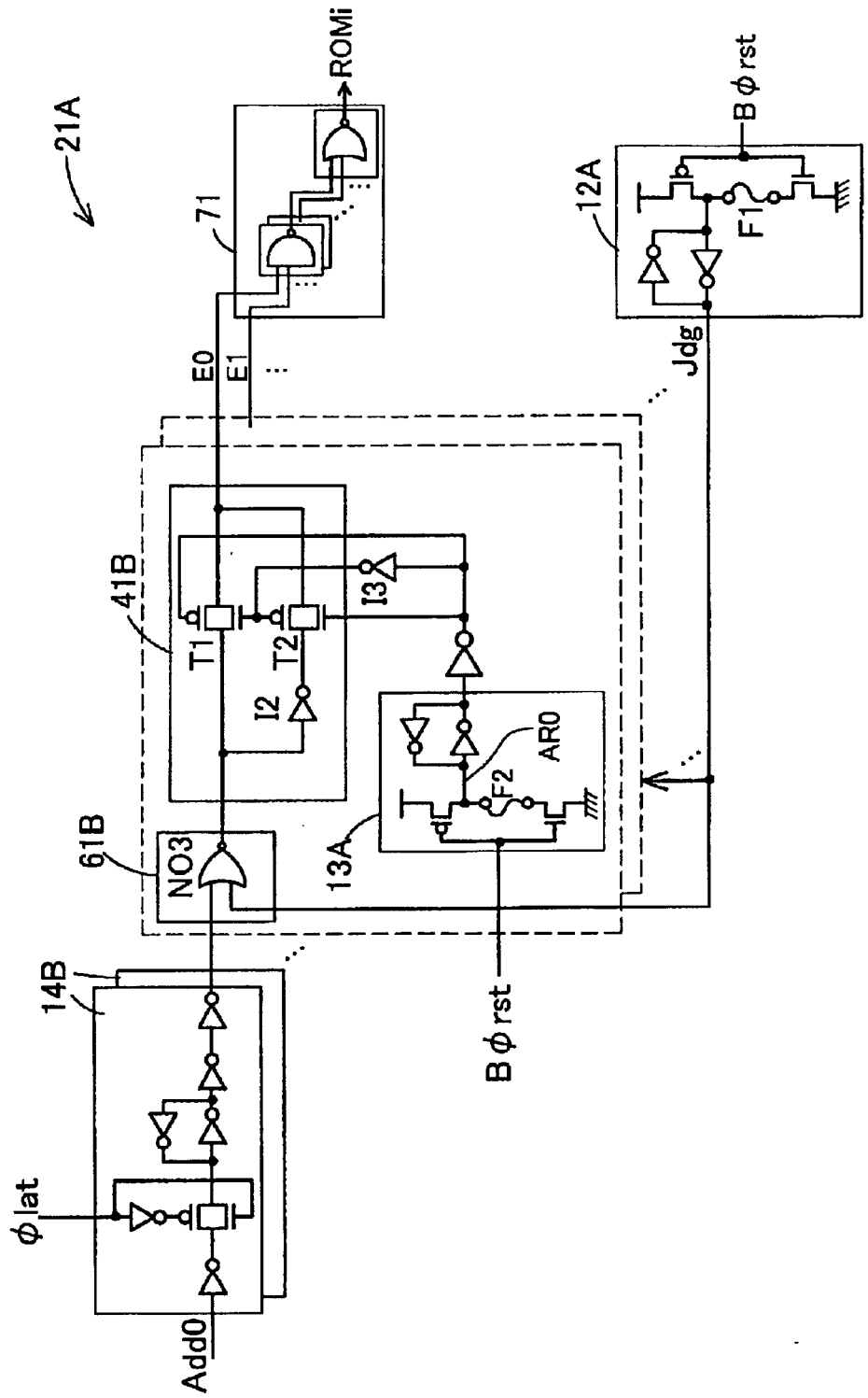
FIG. 8 is a circuit diagram showing a specific example of the redundancy judging circuit of the second embodiment.
Figure 9:
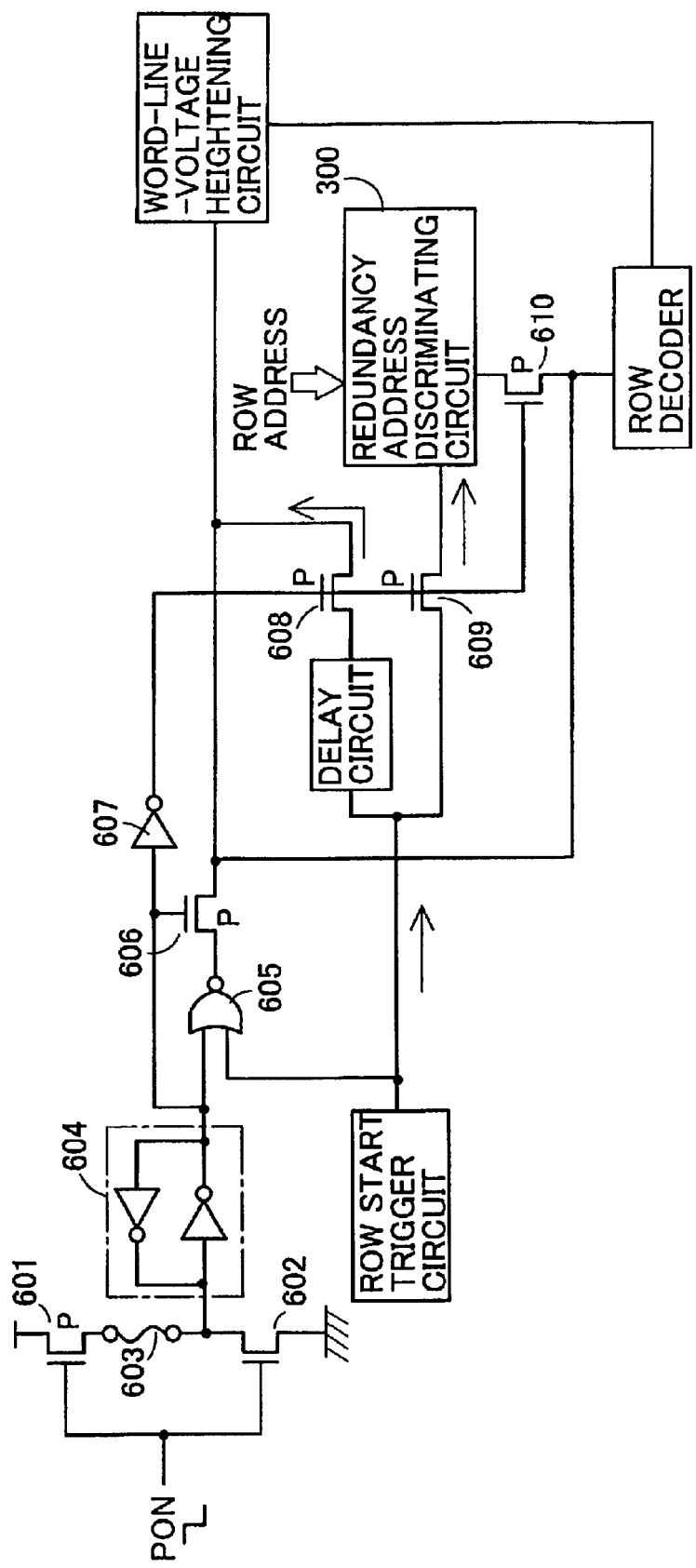
FIG. 9 is a circuit diagram showing the first prior art.
Figure 10:
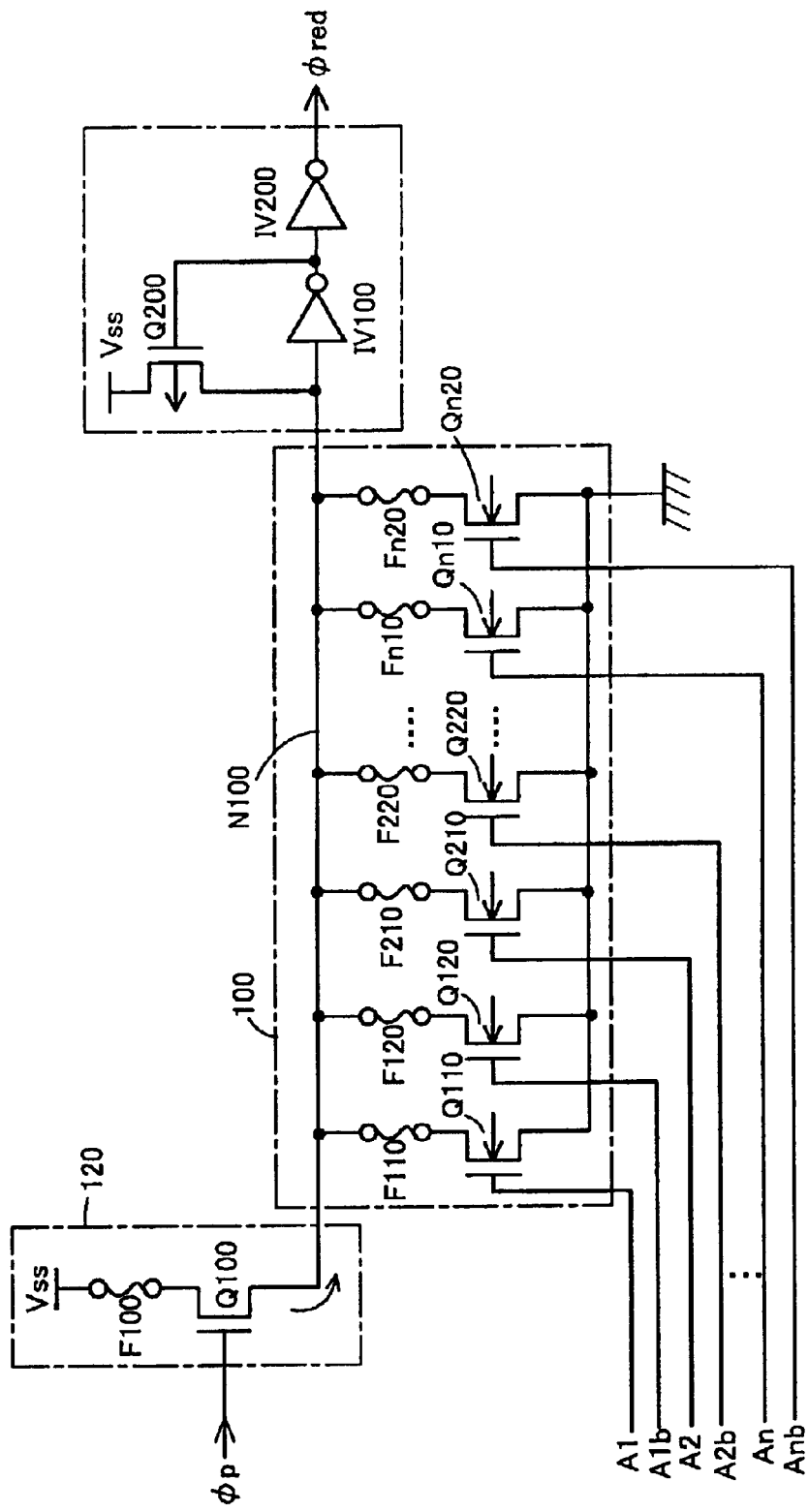
FIG. 10 is a circuit diagram showing the second prior art.
Figure 11:
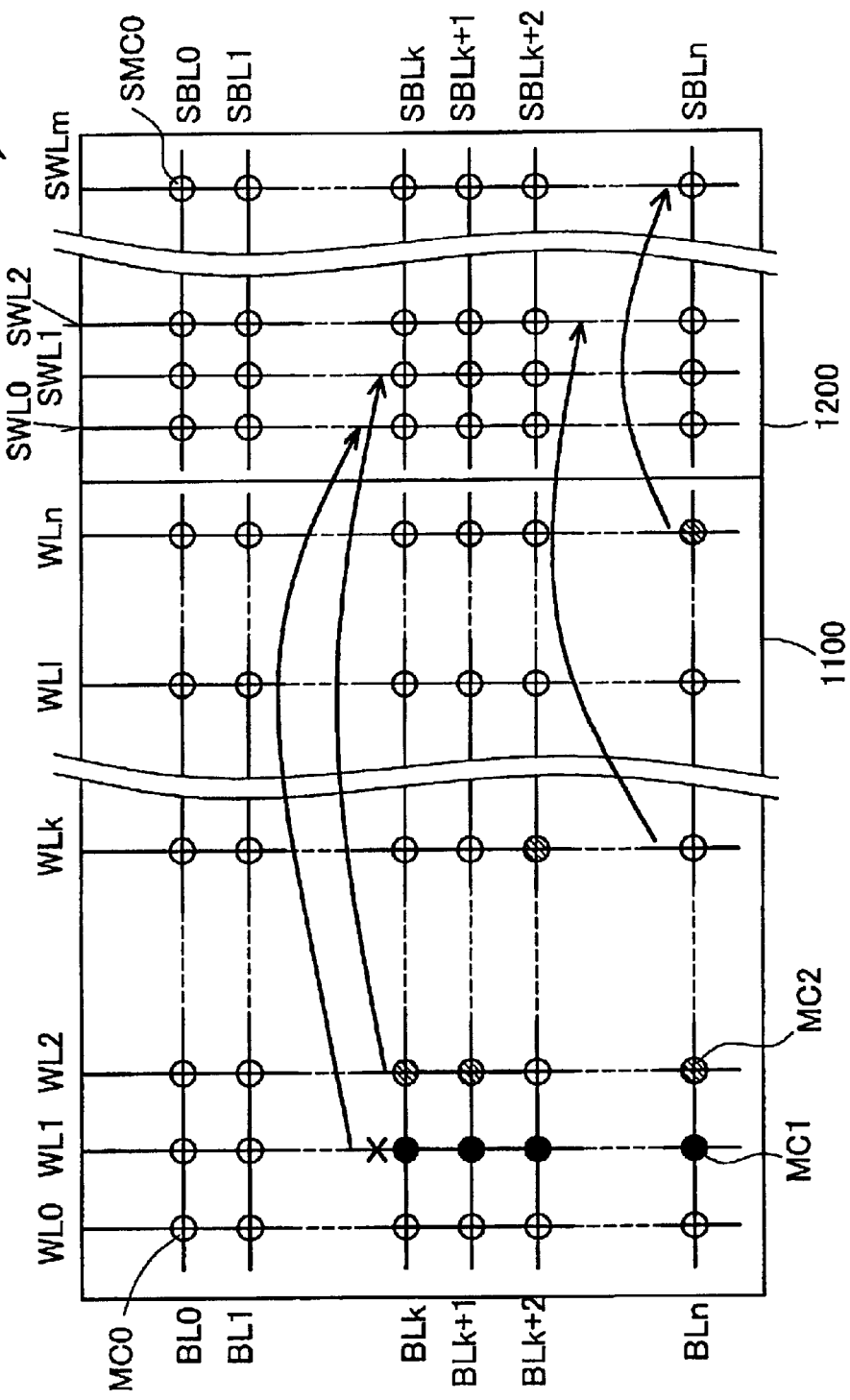
FIG. 11 is a schematic view showing the redundancy of word lines.
Figure 12:
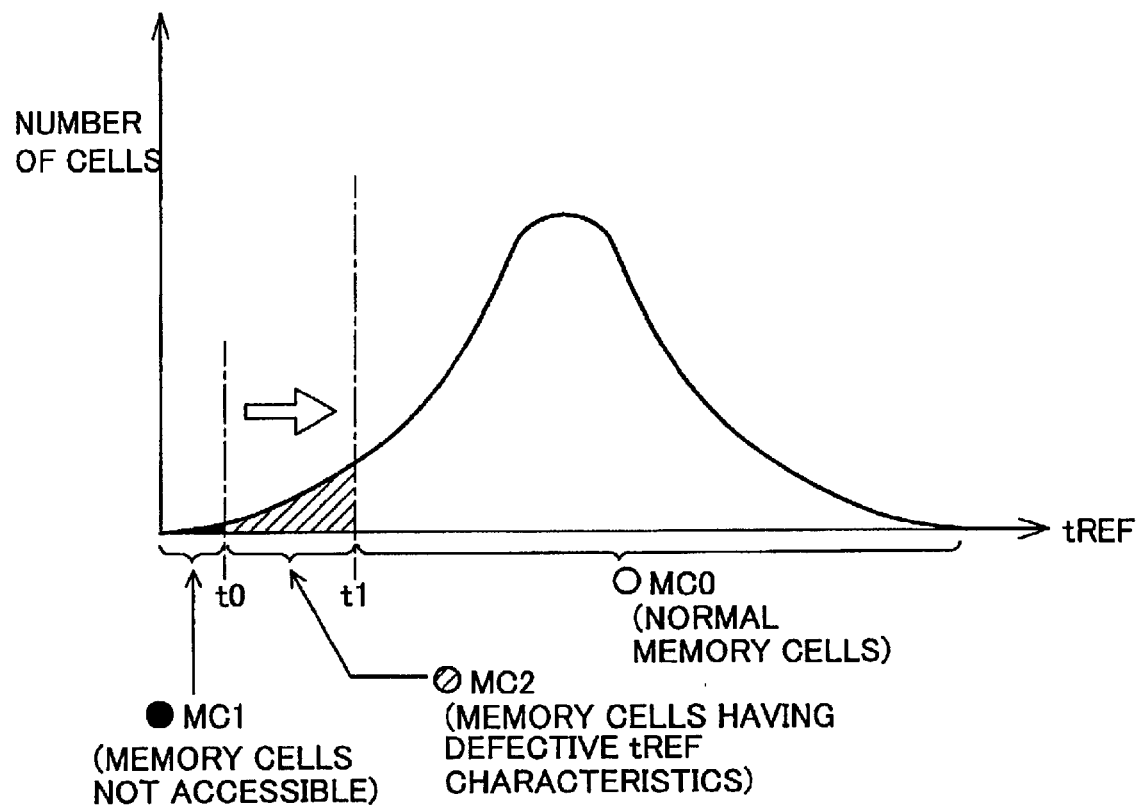
FIG. 12 is a distribution diagram showing data holding time characteristics of memory cells.

FIG. 8 shows a redundancy judging circuit 21A of a specific example of the second embodiment. The redundancy judging circuit 21A is not provided with the switching control section 31A and the logic fixing section 51A which are provided to the redundancy judging circuit 11A of the specific example of the first embodiment. A bit signal AR0 which is stored in a redundancy address section 13A and an anti-phase signal obtained by inverting the bit signal AR0 by the inverter gate 13 are served for performing an open/close control of transfer gates T1, T2 of a comparison-core section 41B as complementary control signals. With the high-logic bit signal AR0, the transfer gate T2 becomes conductive, while with the low-logic bit signal AR0, the transfer gate T1 becomes conductive.

An address buffer 14B supplies a bit signal having the same phase as the bit signal Add0 of address information in a single phase. Accordingly, with respect to the circuit constitution of the comparison-core section 41B which receives signals having a phase equal to a phase of the bit signal Add0, the redundancy judging circuit 11A is, in place of the comparison-core section 41A which is configured to receive the complementary bit signals, provided with a comparison-core section 41B which adopts the comparison-core section 41 indicated in the redundancy judging circuit 11 as the basic constitution. However, an input setting section 61B is configured to include a NOR gate NO3 in place of the inverter gate 11 in the comparison-core section 41. A signal which has the same phase as the bit signal Add0 and a non-redundancy setting signal Jdg are inputted to the NOR gate NO3.

When the change setting is performed, assuming that the non-redundancy judging signal Jdg becomes the low-logic signal, the low-logic signal is inputted to one input terminal of the NOR gate NO3 of the input setting section 61B and the NOR gate NO3 functions as an inverted logic gate. Here, when the NOR gate NO3 and the comparison core section 41B are combined, this combination becomes equivalent to the comparison-core section 41 (see FIG. 7). Using the combination, the comparing operation is performed between the bit signal Add0 and the bit signal AR0 and the comparison result E0 is outputted. Then, the redundant judging circuit 21A performs the judging operation.

When the change setting is not performed, the non-redundancy judging signal Jdg becomes the high-logic signal and the output signal of the NOR gate NO3 is fixed to the low-logic level irrespective of the presence or the absence of the bit signal Add0. Compared to the comparison-core section 41 shown in FIG. 7, the comparison-core section 41B has the circuit constitution which is not provided with the inverter gate 11 and hence, the supply of low logic level to the comparison-core section 41B becomes equivalent to the supply of the voltage value V2 to the comparison-core section 41 when the voltage value V2 is a voltage value of high logic level. Here, when the change setting is not performed, a fuse element F2 of the redundancy address section 13A is not cut and hence, the low logic level is set as the bit signal AR0. With respect to the low-logic bit signal AR0, the transfer gate T1 becomes conductive and hence, the low logic level is outputted as the comparison result E0. That is, the comparison result E0 always indicates the comparison discordance and hence, the redundancy judging circuit 21A discriminates the discordance and there is no possibility that the selecting signal ROMi is outputted.

As has been explained above, according to the redundancy judging circuits 21, 21A of the second embodiment, when the change setting is not performed, due to the non-redundancy setting signal Jdg, the inputting of the bit signals Add0 of address information to at least one or more comparison-core sections 41, 41B is interrupted with respect to respective redundancy judging circuits 21, 21A. Then, the input setting sections 61, 61B are activated so that voltage value V2 of the predetermined logic level is set in place of the bit signal Add0 of address information. Accordingly, the circuit operation from the comparison-core sections 41, 41B to the logic composing section 71 of a subsequent stage can be stopped every redundancy judging circuit 21, 21A whereby the undesired current consumption can be reduced.

Here, when the input setting sections 61, 61B are provided to all comparison-core sections 41, 41B, a driving current which constitutes an input load to the comparison-core sections 41, 41B is not consumed with respect to the transition of the respective bit signals Add0–$n$ of the address information. Further, to obtain the comparison result of discordance, it is sufficient if at least one input setting section 61, 61B is provided and the comparison result E0–$n$ of comparison discordance can be obtained with respect to at least one bit signal AR0–$n$ whereby the current consumption caused by the input setting section 61, 61B can be reduced to the necessity of the minimum amount.

Since respective comparison-core sections 41, 41B are also constituted of combinational logic circuits, the input load is small compared to the dynamic-type circuit constitution of the prior art. Accordingly, the driving current of the input load which is caused by the transition of address information is also small and hence, the current consumption reduction effect at the time of limiting the redundancy judging circuits 21, 21A to be operated can be also enhanced.

With respect to the DRAM or the like used in the portable equipment, particularly with respect to such a DRAM or the like having the refreshing redundancy function, the circuit operation of the undesired redundancy judging circuits 21, 21A can be stopped. Accordingly, in addition to the reduction of the current consumption due to the refreshing redundancy function at the time of refreshing operation, the current consumption which is caused by the redundancy judgment can be also reduced. By further reducing the current consumption during standby time, the continuous use time characteristics at the time of battery driving can be further enhanced.

Further, the frequency of the redundancy judgment is reduced along with the reduction of the use rate of the auxiliary memory cells and the number of undesired redundancy judging circuits 21, 21A are increased so that the current consumption can be efficiently reduced with respect to the semiconductor memory device which reduces the use rate of the auxiliary memory cells.

Here, it is needles to say that the present invention is not limited to the above-mentioned embodiments and various modifications and variations can be conceived without departing from the gist of the present invention.

For example, in the specific example (FIG. 6) of the first embodiment, the constitution which supplies the complementary bit signals from the address buffer 14A is described, while in the specific example (FIG. 8) of the second embodiment, the constitution which supplies the bit signals of a single phase from the address buffer 14B is described. However, the present invention is not limited to such constitutions and it may be possible to adopt a constitution in which the address buffers are exchanged from each other and comparison-core sections suitable to respective address buffers are provided.

Further, the logic level of the non-redundancy judging signal Jdg, the selecting signal ROMi or the like is not fixed to the logic level indicated in the respective embodiments. That is, so long as the predetermined relationship is established, the logic level is not limited. Accordingly, the logic constitution of the comparing section which is centered around the comparison-core section 41, 41A, 41B, the logic constitution of the logic composing section 71 of subsequent stage, the logic constitutions of the first and second logic composing sections 72, 73 in the inside of the logic composing section 71 and the like can be suitably changed.

Further, although the case in which the information is stored in the redundancy setting section 12 and the redundancy address section 13 by cutting or without cutting the fuse elements has been explained, it is needless to say that "the cutting" or "without cutting" may have opposite meanings from each other. Further, the memory element may use a ROM such as a mask ROM, an EPROM, an EEPROM or the like in place of the fuse element. Further, any other means which can store information such as a RAM formed of a SRAM or a DRAM and the like, and other registers can be used. When volatile memory unit is used as the memory unit, the memory information may be loaded at the time of power-ON.

Further, as the specific example of the input setting section 61 (FIG. 7) of the second embodiment, the input setting section 61B which is provided with the NOR gate NO3 shown in FIG. 8 has been explained. However, the input setting section 61 is not limited to such a constitution. For example, the input setting section 61 may have a constitution similar to the constitutions of the transfer gate T1 and the logic fixing section 51A in the redundancy judging circuit 1A (FIG. 6) of the specific example of the first embodiment, for example. In this case, as the control signal of the transfer gates, the non-redundancy setting signal Jdg and an anti-phase signal of the non-redundancy setting signal Jdg are supplied as complementary signals, and as the voltage value which is connected by the logic fixing section 51A, the voltage value V2 which indicates the high logic level may be selected in place of the ground potential. With respect to the non-redundancy setting signal Jdg of low logic level which indicates that the change setting to the auxiliary memory cells is performed, the transfer gate is made conductive and the logic fixing section is inactivated, while with respect to the non-redundancy setting signal Jdg of high logic level which indicates that the change setting to the auxiliary memory cells is not performed, the transfer gate is made non-conductive and the logic fixing section is activated.

According to the present invention, it is possible to provide the semiconductor memory device and the redundancy judging method in which at the time of performing the static-type redundancy judging operation, undesired judging operations can be individually stopped and hence, the judging operation can be performed with the necessary of the minimum current consumption.

What is claimed is:

1. A semiconductor memory device including at least one redundancy judging circuit, the redundancy judging circuit comprising:

a redundancy setting section in which the presence or the absence of substitute to auxiliary memory cells is set, a plurality of comparing sections which compare inputted address information and redundancy address information to be substituted to the auxiliary memory cells for every bit based on an EXCLUSIVE-OR control which is constituted of a combinational logic circuit, a logic composing section which performs a logic operation of output signals from the comparing sections by combinational logic circuits and judges the accordance/discordance of the address information and the redundancy address information, and a logic fixing section which fixes at least one of output signals from the comparing sections to a predetermined logic level, wherein based on a non-redundancy setting signal from the redundancy setting section which indicates absence of substitute setting, the comparing sections are inactivated so that the comparing operation is stopped and the logic fixing section is activated.

2. A semiconductor memory device according to claim 1, wherein the address information and the redundancy address information respectively include two logic signals complementing to each other for every bit, each of the comparing sections include a switching section which is controlled by the two logic signals complementing to each other which constitute every bit of the redundancy address information and selects one of the two logic signals complementing to each other which constitute every bit of the address information as an EXCLUSIVE-OR output, and the inactivation of each of the comparing sections is performed by making the switching section select to none of the two logic signals.

3. A semiconductor memory device according to claim 1, wherein the predetermined logic level accords with a logic level which indicates that each of the comparison sections outputs a comparison result of discordance.

4. A semiconductor memory device including at least one redundancy judging circuit, the redundancy judging circuit comprising:

a redundancy setting section in which the presence or the absence of substitute to auxiliary memory cells is set, a plurality of comparing sections which compare inputted address information and redundancy address information to be substituted to the auxiliary memory cells for every bit based on an EXCLUSIVE-OR control which is constituted of a combinational logic circuit, a logic composing section which performs a logic operation of output signals from the comparing sections by combinational logic circuits and judges the accordance/discordance of the address information and the redundancy address information, and an input setting section which supplies input signals of a predetermined logic level in place of respective bit signals of address information to at least one of the comparing sections, wherein based on a non-redundancy setting signal from the redundancy setting section which indicates that the absence of substitute is set, the input setting section is activated.

5. A semiconductor memory device according to claim 4, wherein the address information and the redundancy address information respectively include two logic signals complementing to each other for every bit, and each of the comparing sections includes a switching section which is controlled by the two logic signals complementing to each other which constitute every bit of the redundancy address information and selects one of the two logic signals complementing to each other which constitute every bit of the address information as an EXCLUSIVE-OR output.

6. A semiconductor memory device according to claim 4, wherein the input setting section includes a combinational logic circuit to which respective bit signal of the address information and the non-redundancy setting signal are inputted and which outputs input signal to each comparing section, and the respective bit signal of the address information is masked based on the non-redundancy setting signal and the input signal to each of the comparing sections is fixed to a predetermined logic level.

7. A semiconductor memory device according to claim 4, wherein the input setting section includes an input switching section which is controlled based on the presence or the absence of the non-redundancy setting signal and is opened or connected to a path which supplies the each bit signal of the address information to the respective comparing sections as input signals, and an input logic fixing section which fixes input signals to the respective comparing sections to a predetermined logic level, wherein based on the non-redundancy setting signal, the input switching section is opened and hence, respective bit signal of the address information is separated from an input signal to the respective comparing sections and the input logic fixing section is activated.

8. A semiconductor memory device according to claim 4, wherein the predetermined logic level at which an input signal to each comparing section is fixed discords with logic level of respective bit signal of the redundancy address information.

9. A semiconductor memory device according to claim 2, wherein every bit of the address information constitutes one logic signal out of the two logic signals complementing to each other, and the other logic signal out of two logic signals complementing to each other is generated by a logic inversing section provided to each of the comparing sections.

10. A semiconductor memory device according to claim 2, wherein the respective bit signals of the redundancy address information constitute one logic signal out of the two logic signals complementing to each other, and the other logic signal out of two logic signals complementing to each other is generated by a logic inversing section provided to the each comparing section.

11. A semiconductor memory device according to claim 5, wherein every bit of the address information constitutes one logic signal out of the two logic signals complementing to each other, and the other logic signal out of two logic signals complementing to each other is generated by a logic inversing section provided to each of the comparing sections.

12. A semiconductor memory device according to claim 5, wherein every bit of the redundancy address information constitutes one logic signal out of the two logic signals complementing to each other, and the other logic signal out of two logic signals complementing to each other is generated by a logic inversing section provided to each comparing section.

13. A redundancy judging method of a semiconductor memory device comprising:

a redundancy setting process in which presence or absence of substitute to auxiliary memory cells is set;

in case presence of substitute is set, the redundancy judging method further comprising:

a comparing process in which inputted address information and redundancy address information to be substituted to the auxiliary memory cells are compared to each other for every bit based on an EXCLUSIVE-OR control which is constituted of a combinational logic; and a judging process in which comparison results obtained by the comparing process are subjected to a logic operation based on combinational logic and the accordance/discordance of the address information and the redundancy address information is judged; and in case absence of substitute is set, the redundancy judging method further comprising:

a comparing-stopping process in which the comparing of the address information and the redundancy address information for every bit is stopped;

a setting process in which among the comparison results for every bit which are stopped in the comparing stopping process, at least one comparing result is set to a predetermined value; and a discordance judging process in which based on the predetermined value set to at least one comparison result, the discordance of the address information and the redundancy address information is judged.

14. A redundancy judging method of a semiconductor memory device according to claim 13, wherein the address information and the redundancy address information respectively include two logic signals complementing to each other for every bit, the comparing process includes a switching process which is controlled by the two logic signals complementing to each other which constitute every bit of the redundancy address information and selects one of the two logic signals complementing to each other which constitute every bit of the address information and adopts selected logic signal as the comparison result of the EXCLUSIVE-OR control, and the comparing-stopping process includes a switch stopping process in which neither of the two logic signals complementing to each other which constitute every bit of the address information is adopted as the comparison result.

15. A redundancy judging method of a semiconductor memory device according to claim 13, wherein the predetermined value set in the setting process accords with the comparison result of discordance due to the comparing process.

16. A redundancy judging method of a semiconductor memory device comprising:

a redundancy setting process in which the presence or the absence of the change to auxiliary memory cells is set;

in case presence of substitute is set, the redundancy judging method further comprising:

a comparing process in which inputted address information and redundancy address information to be changed to the auxiliary memory cells are compared to each other for every bit based on an EXCLUSIVE-OR control which is constituted of a combinational logic; and a judging process in which comparison results obtained by the comparing process are subjected to a logic operation based on combinational logic and the accordance/discordance of the address information and the redundancy address information is judged; and in case absence of substitute is set, the redundancy judging method further comprising:

a pseudo-comparing process in which a predetermined value which substitutes for the address information and the redundancy address information are compared to each other for at least one bit based on an EXCLUSIVE-OR control which is constituted of a combinational logic; and a discordance judging process in which based on at least one comparison result obtained by the pseudo-comparing process, the discordance of the address information and the redundancy address information is judged.

17. A redundancy judging method of a semiconductor memory device according to claim 16, wherein the address information and the redundancy address information respectively include two logic signals complementing to each other for every bit, the comparing process includes a switching process which is controlled by the two logic signals complementing to each other which constitute every bit of the redundancy address information and selects one of the two logic signals complementing to each other which constitute every bit of the address information and adopts selected logic signal as the comparison result of the EXCLUSIVE-OR output.

18. A redundancy judging method of a semiconductor memory device according to claim 16, wherein the pseudo-comparing process includes an input setting process in which based on a logic operation using at least one bit of the address information and the setting result of absence of substitute in the redundancy setting process, the address information is masked, and a given value which substitutes for the address information is supplied.

19. A redundancy judging method of a semiconductor memory device according to claim 16, wherein the pseudo-comparing process includes;
an input switching process which is controlled based on the setting result which indicates presence or absence of the substitute due to the redundancy setting process and connects or opens a supply path of the address information, and
a predetermined-value supplying process in which a predetermined value which substitutes for the address information is supplied when the supply path is opened.

20. A redundancy judging method of a semiconductor memory device according to claim 16, wherein the predetermined value which substitutes for the address information discords with the redundancy address information.

21. A redundancy judging method of a semiconductor memory device being characterized in that in case presence of substitute to auxiliary memory cells is set with respect to memory cells of a predetermined address, inputted address information and redundancy address information to be changed to the auxiliary memory cells are compared to each other for every bit based on an EXCLUSIVE-OR control which is constituted of a combinational logic, and comparison results obtained by the comparison operation are subjected to a logic operation based on combinational logic and the accordance/discordance of the address information and the redundancy address information is judged thus performing the redundancy judgment whether the change to the auxiliary memory cells is to be executed or not, and in case absence of substitute is set, the comparison operation is stopped and at least one of the comparison results is set to a predetermined value so that the redundancy judging result of absence of substitute to the auxiliary memory cells is obtained.

22. A redundancy judging method of a semiconductor memory device according to claim 21, wherein the execution or the stopping of the comparison operation is performed by connecting or opening a propagation path of the address information.

23. A redundancy judging method of a semiconductor memory device according to claim 21, wherein the predetermined value of the comparison result accords with a comparison result outputted from the comparison operation when the address information and the redundancy address information discord with each other.

24. A redundancy judging method of a semiconductor memory device according to claim 21, wherein the comparison operation is performed every corresponding bit with respect to the address information and the redundancy address information, and the predetermined value of the comparison result is set with respect to the comparison result of at least any one out of the corresponding bits.

25. A redundancy judging method of a semiconductor memory device being characterized in that in case presence of substitute to auxiliary memory cells is set with respect to memory cells of a predetermined address, inputted address information and redundancy address information to be substituted to the auxiliary memory cells are compared to each other for every bit based on an EXCLUSIVE-OR control which is constituted of combinational logic, and comparison results obtained by the comparison operation are subjected to a logic operation based on combinational logic and the accordance/discordance of the address information and the redundancy address information is judged thus performing the redundancy judgment whether the change to the auxiliary memory cells is to be executed or not, and in case absence of substitute is set, the address information is set to a predetermined value so that the redundancy judging result of absence of substitution to the auxiliary memory cells is obtained.

26. A redundancy judging method of a semiconductor memory device according to claim 25, wherein the setting of the address information to the predetermined value is performed when the inputting of the address information is interrupted and the predetermined value is set in place of the address information.

27. A redundancy judging method of a semiconductor memory device according to claim 25, wherein the predetermined value is information which is different from the redundancy address information and a comparison result of discordance is obtained by the comparing operation.

* * * * *